(12) United States Patent
Kubota

(10) Patent No.: US 10,290,669 B2
(45) Date of Patent: May 14, 2019

(54) LIGHT SCREENING COMPOSITION

(71) Applicant: FUJIFILM Corporation, Tokyo (JP)

(72) Inventor: Makoto Kubota, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 225 days.

(21) Appl. No.: 15/358,760

(22) Filed: Nov. 22, 2016

(65) Prior Publication Data

US 2017/0077159 A1 Mar. 16, 2017

Related U.S. Application Data

(63) Continuation of application No. PCT/JP2015/063786, filed on May 13, 2015.

(30) Foreign Application Priority Data

May 27, 2014 (JP) .................. 2014-109290

(51) Int. Cl.
| | |
|---|---|
| *H01L 27/14* | (2006.01) |
| *H01L 27/146* | (2006.01) |
| *C08F 2/44* | (2006.01) |
| *G02B 5/22* | (2006.01) |
| *G03F 7/004* | (2006.01) |

(Continued)

(52) U.S. Cl.
CPC .......... *H01L 27/14623* (2013.01); *C08F 2/44* (2013.01); *G02B 5/223* (2013.01); *G02B 7/021* (2013.01); *G03F 7/0042* (2013.01); *G03F 7/032* (2013.01); *G03F 7/033* (2013.01); *G03F 7/035* (2013.01); *G03F 7/038* (2013.01); *G03F 7/0388* (2013.01); *G03F 7/105* (2013.01); *H01L 27/14645* (2013.01); *H01L 31/02164* (2013.01); *H01L 31/02325* (2013.01); *H01L 27/14621* (2013.01)

(58) Field of Classification Search
CPC ...... G03F 7/0005; G03F 7/0007; G03F 7/032; G03F 7/033; G03F 7/035; G03F 7/038; G03F 7/0388; G03F 7/105; H01L 27/14623; H01L 33/02164
USPC ........ 430/7, 281.1, 286.1; 257/440; 349/110
See application file for complete search history.

(56) References Cited

U.S. PATENT DOCUMENTS

| | | | | |
|---|---|---|---|---|
| 2009/0236509 A1* | 9/2009 | Maruyama | ............ | G03F 7/0007 250/237 R |
| 2010/0025166 A1* | 2/2010 | Suzuki | ................ | F16D 55/2245 188/73.31 |
| 2015/0065598 A1* | 3/2015 | Paek | ....................... | G03F 7/027 522/8 |

FOREIGN PATENT DOCUMENTS

| | | |
|---|---|---|
| CN | 101154038 A | 4/2008 |
| JP | 2008-51934 A | 3/2008 |
| | (Continued) | |

OTHER PUBLICATIONS

Communication dated May 16, 2017, from the Japanese Patent Office in counterpart application No. 2016-523415.

(Continued)

*Primary Examiner* — John A McPherson
(74) *Attorney, Agent, or Firm* — Sughrue Mion, PLLC

(57) ABSTRACT

The present invention is to provide a light screening composition that allow forming of a light screening film having excellent adhesiveness to a substrate and excellent residue removability at the time of development. The light screening composition according to the invention contains (A) any one of light screening particles and a light screening dye; (B) a dispersing resin; (C) a binder polymer having an acid value of 50 mg KOH/g or less and a weight-average molecular weight of 8,000 to 50,000; and (D) a polymerizable compound.

14 Claims, 3 Drawing Sheets

(51) Int. Cl.
*G03F 7/033* (2006.01)
*G03F 7/038* (2006.01)
*G02B 7/02* (2006.01)
*G03F 7/032* (2006.01)
*G03F 7/035* (2006.01)
*G03F 7/105* (2006.01)
*H01L 31/0216* (2014.01)
*H01L 31/0232* (2014.01)

(56) References Cited

FOREIGN PATENT DOCUMENTS

| JP | 2008-88272 A | 4/2008 |
| JP | 2012-237952 A | 12/2012 |
| WO | 2012/115255 A1 | 8/2012 |

OTHER PUBLICATIONS

The First Office Action, dated Sep. 11, 2017, issued in corresponding CN Application No. 201580027870.0, 12 pages in English and Chinese.
International Preliminary Report on Patentability issued from the International Bureau in counterpart International Application No. PCT/JP2015/063786, dated Dec. 8, 2016.
International Search Report of PCT/JP2015/063786, dated Jun. 16, 2015. [PCT/ISA/210].
Second Office Action dated Mar. 23, 2018, issued in corresponding CN Application No. 201580027870.0, 11 pages in English and Chinese.
Taiwanese Communication dated Mar. 8, 2019, issued in corresponding Taiwanese Application No. 104116162, 8 pages in English and Chinese.

* cited by examiner

LIGHT SCREENING COMPOSITION

CROSS-REFERENCE TO RELATED APPLICATIONS

This application is a Continuation of PCT International Application No. PCT/JP2015/063786 filed on May 13, 2015, which claims priority under 35 U.S.C. § 119(a) to Japanese Patent Application No. 2014-109290 filed on May 27, 2014. The above application is hereby expressly incorporated by reference, in its entirety, into the present application.

BACKGROUND OF THE INVENTION

1. Field of the Invention

The invention relates to a light screening composition.

2. Description of the Related Art

A light screening film is provided to a solid-state imaging device such as a charge coupled device (CCD) or a complementary metal oxide semiconductor (CMOS), for the purpose of prevention of noise generation or improvement of image quality.

As a composition for forming a light screening film for a solid-state imaging device, a light screening composition containing a black coloring material such as carbon black or titanium black is known (see JP2012-237952A).

SUMMARY OF THE INVENTION

JP2012-237952A discloses that, if the disclosed light screening composition is used, a light screening film with favorable coating evenness, favorable gap filling ability, and satisfactory durability on high temperature and high humidity can be formed.

Meanwhile, as a solid-state imaging device is miniaturized, thinned, and caused to be highly sensitive, further improvement of adhesiveness of a light screening film to a substrate and further improvement of removability of residues at the time of development performed when the light screening film is manufactured are required.

The inventors of the invention examined adhesiveness to a substrate and residue removability at the time of development by using the light screening composition disclosed in JP2012-237952A and found that, the light screening composition satisfies a level required in the related art but does not satisfy a level higher than that now required, and thus further improvement is required.

In view of the circumstances described above, the invention is for providing a light screening composition that allows formation of a light screening film having excellent adhesiveness to a substrate and excellent residue removability at the time of development.

The inventors of the invention have diligently conducted research, found that the objects described above can be achieved by using a composition including predetermined components, and completed the invention.

That is, the inventors of the invention have found that the object described above can be achieved by configurations described below.

(1) A light screening composition, comprising: at least (A) any one of light screening particles and a light screening dye; (B) a dispersing resin; (C) a binder polymer having an acid value of 50 mgKOH/g or less and a weight-average molecular weight of 8,000 to 50,000; and (D) a polymerizable compound.

(2) The light screening composition according to (1), in which an acid value of the binder polymer is 20 to 50 mgKOH/g, and an SP value thereof is 15 to 30 $(MPa)^{1/2}$.

(3) The light screening composition according to (1) or (2), in which an SP value of the dispersing resin is 15 to 30 $(MPa)^{1/2}$.

(4) The light screening composition according to any one of (1) to (3), in which an absolute value of a difference between an SP value of the dispersing resin and an SP value of the binder polymer is 3 $(MPa)^{1/2}$ or greater, and the difference represents an SP value of the dispersing resin—an SP value of the binder polymer.

(5) The light screening composition according to any one of (1) to (4), in which any one of the light screening particles and the light screening dye is carbon black.

According to the invention, it is possible to provide a light screening composition that allows forming of a light screening film having excellent adhesiveness to a substrate and excellent residue removability at the time of development.

DESCRIPTION OF THE PREFERRED EMBODIMENTS

Figure 1:
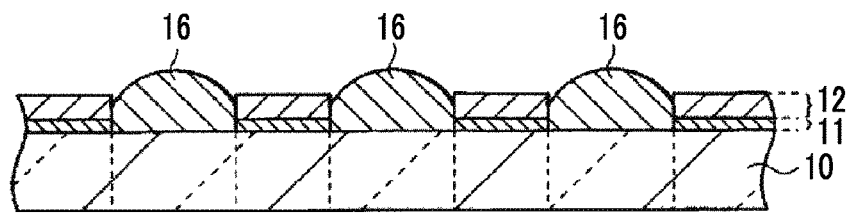
FIG. 1 is a cross-sectional view of a first embodiment to which a light screening film according to the invention is applied.

Hereinafter, respective components that a light screening composition according to the invention (hereinafter, simply referred to as a "composition") can contain are described in detail.

In the description of a group (atomic group) in this specification, the description in which substitution or unsubstitution is not provided includes a group having a substituent together with a group not having a substituent. For example, an "alkyl group" includes not only an alkyl group not having a substituent (unsubstituted alkyl group) but also an alkyl group having a substituent (substituted alkyl group).

The expression "radioactive ray" in this specification means rays including visible light, ultraviolet rays, far ultraviolet rays, electron beams, and X rays.

The description of configuration requirements described below is provided based on representative embodiments of the invention but the invention is not limited thereto. The numerical scopes described by using "to" in this specification mean a scope of including numerical values before and after "to" as a lower limit value and an upper limit value.

In this specification, the expression "(meth)acrylate" refers to acylate and methacrylate, the expression "(meth)acryl" means acryl and methacryl, and the expression "(meth)acryloyl" means acryloyl and methacryloyl. In this specification, a "monomer" and a "monomer" have the same meaning. The monomer according to the invention is differentiated from an oligomer and a polymer, and refers to a compound having a mass average molecular weight of 2,000 or less. In this specification, a polymerizable compound refers to a compound having a polymerizable group. A polymerizable compound may be a monomer or may be a polymer. The polymerizable group refers to a group participating in polymerization reaction.

(A) Any one of light screening particles and a light screening dye, (B) a dispersing resin, (C) a binder polymer having an acid value of 50 mg KOH/g or less and a weight-average molecular weight of 8,000 to 50,000, and (D) a polymerizable compound are at least included in the light screening composition (composition for forming light screening film).

Hereinafter, the components above are described in detail.

((A) Light Screening Particles and Light Screening Dye)

The light screening particles and the light screening dye (hereinafter, these are collectively referred to as a "light screening material") used in the invention preferably have absorption mainly with respect to light in a wavelength range of 800 to 1,200 nm and satisfactory transmittance of light used in the exposure.

As the light screening particles and the light screening dye according to the invention, any one of light screening particles and a light screening dye having absorption with respect to light in a wavelength range of 800 to 1,200 nm can be used. However, in view of heat resistance, light screening particles are preferable. The light screening particles are preferably fine particles. A particle diameter indicating a maximum value in particle size distribution is preferably in the range of 5 to 100 nm, more preferably in the range of 5 to 50 nm, and even more preferably in the range of 5 to 30 nm. If the particle diameter is in the range described above, light screening particles less precipitate with time and thus temporal stability of the composition according to the invention becomes more satisfactory.

A total content of the light screening material in the composition is not particularly limited. However, in view of making light screening characteristics of the light screening film more excellent, the content thereof is preferably great. When the content is too great, light screening with respect to ultraviolet ray used in the patterning becomes too high and thus disadvantageous. Therefore, the content thereof is preferably 20 to 70 mass %, more preferably 25 to 50 mass %, even more preferably 25 to 35 mass %, and particularly preferably 30 to 35 mass % with respect to the total solid content in the composition.

The total solid content means a total mass of a component (for example, a light screening material, a binder polymer, and a polymerizable compound) that can form a light screening film described below, and a component that does not form a film such as a solvent is not included.

In the composition, both of the light screening particles and the light screening dye may be included.

Examples of a dye that can be used as the light screening dye include a metal complex coloring agent such as a cyanine coloring agent, a phthalocyanine coloring agent, a naphthalocyanine coloring agent, an immonium coloring agent, an aminium coloring agent, a quinolium coloring agent, a pyrylium coloring agent, or an Ni complex coloring agent.

In view of heat resistance, as the light screening particles, a pigment selected from an organic pigment and an inorganic pigment is preferable, and an inorganic pigment is particularly preferable.

Examples of the inorganic pigment that can be used as the light screening particles include carbon black, titanium black, a tungsten compound, zinc white, white lead, lithopone, titanium oxide, chromium oxide, iron oxide, precipitated barium sulfate and barite powder, red lead, iron oxide red, chrome yellow, zinc yellow (zinc yellow type 1, zinc yellow type 2), ultramarine blue, Prussian blue (potassium ferric ferrocyanide), zircon gray, praseodymium yellow, chrome titanium yellow, chrome green, peacock, Victoria Green, deep blue (different from Prussian blue), vanadium zirconium blue, chrome tin pink, manganese pink, and salmon pink. As the black pigment, metal oxide or metal nitride including one or two or more metal elements selected from a group consisting of Co, Cr, Cu, Mn, Ru, Fe, Ni, Sn, Ti, and Ag, or a mixture thereof can be used.

In these inorganic pigments, in view of infrared light screening properties, carbon black, titanium black, titanium oxide, iron oxide, manganese oxide, and graphite are preferable. Among these, the inorganic pigment preferably includes at least one of carbon black or titanium black and carbon black is particularly preferable.

As the carbon black, those disclosed in paragraph numbers [0020] to [0024] of JP2006-301101A can be used.

((B) Dispersing Resin)

The composition contains a dispersing resin for improving dispersion stability of a light screening material (particularly, light screening particles).

An SP value of the dispersing resin is not particularly limited. However, since at least one of adhesiveness to a substrate or residue removability at the time of developing is more excellent (hereinafter, simply referred to as "since effects of the invention become more excellent"), an SP value is preferably 15 to 30 $(MPa)^{1/2}$ and more preferably 17 to 22 $(MPa)^{1/2}$.

The SP value according to the invention is a solubility parameter, and refers to a solubility parameter measured by an OKITSU method. The OKITSU method is disclosed in "Journal of the Adhesion Society of Japan", Vol. 29, No. 5 (1993). The SP value of the dispersing resin refers to a value obtained in a manner described below. First, the SP value of a monomer for forming a dispersing resin is obtained by the OKITSU method. Subsequently, a product of an SP value of a monomer and a mass fraction of a monomer in a dispersing resin for each type of a monomer is obtained. Subsequently, an SP value of a dispersing resin is obtained by adding the product obtained for each type of a monomer.

For example, an SP value of a dispersing resin a which is a copolymer of a monomer A having an SP value of 15 $MPa^{1/2}$ (10 mass %), a monomer B having an SP value of 18 $MPa^{1/2}$ (20 mass %), and a monomer C having an SP value of 20 $MPa^{1/2}$ (70 mass %) is obtained in an expression below.

SP value $(MPa^{1/2})$ of the dispersing resin a: 15 $(MPa^{1/2}) \times (10/100) + 18 (MPa^{1/2}) \times (20/100) + 20 (MPa^{1/2}) \times (70/100) = 19.1 (MPa^{1/2})$ The dispersing resin is preferably a dispersing resin having a structural unit having a graft chain and more preferably a dispersing resin having a structural unit having a graft chain and a hydrophobic structural unit different from the structural unit having a graft chain.

Examples of the dispersing resin include polyamideamine and a salt thereof, polycarboxylic acid and a salt thereof, high molecular weight unsaturated acid ester, modified polyurethane, modified polyester, modified poly(meth)acrylate, a (meth)acrylic copolymer, a naphthalene sulfonic acid formalin condensate, polyoxyethylene alkyl phosphoric acid ester, and polyoxyethylene alkyl amine.

The dispersing resin can be further classified into a linear polymer, a terminal modified polymer, a graft polymer, and a block polymer according to the structure thereof.

The dispersing resin is absorbed to a surface of a dispersoid (light screening material) and functions so as to prevent reaggregation. Therefore, preferable structures thereof further include terminal modified polymer, a graft polymer, and a block polymer that have anchor sites on the surfaces thereof.

As described above, the dispersing resin preferably has a structural unit having a graft chain. In this specification, the "structural unit" and the "repeating unit" have the same meaning. Such a dispersing resin having a structural unit having a graft chain has affinity with a solvent by a graft chain and thus dispersibility of a dispersoid and dispersion stability after the lapse of time are excellent. Due to the existence of a graft chain, the composition has affinity with a polymerizable compound or a resin that can be combined with the other, and thus a residue is hardly generated by alkali development.

As the graft chain becomes long, a stereoscopic repulsion effect becomes high, and dispersibility improves. However, if a graft chain is too long, absorbing power to a dispersoid decreases, and thus dispersibility tends to decrease, in some cases. Therefore, with respect to a graft chain, the number of atoms excluding hydrogen atoms is preferably in the range of 40 to 10,000, the number of atoms excluding hydrogen atoms is more preferably 50 to 2,000, and the number of atoms excluding hydrogen atoms is even more preferably 60 to 500. Here, the graft chain refers to a portion from a root (an atom bonding to a main chain in a group branched from a main chain) of a main chain of a copolymer to a terminal of a group branched from a main chain.

The graft chain preferably has a polymer structure, and examples of this polymer structure include a polyacrylate structure (for example, a poly(meth)acryl structure), a polyester structure, a polyurethane structure, a polyurea structure, a polyamide structure, and a polyether structure.

In order to improve interaction properties between a graft site and a solvent and thus increase dispersibility, the graft chain is preferably a graft chain having at least one type selected from the group consisting of a polyester structure, a polyether structure, and a polyacrylate structure and more preferably a graft chain having at least one of a polyester structure or a polyether structure.

A structure of a macromonomer having such a polymer structure as a graft chain is not particularly limited, as long as the structure has a substituent that can react with a polymer main chain portion. However, it is preferable that a macromonomer having a reactive double bonding group can be suitably used.

Corresponding to a structural unit having a graft chain that a dispersing resin has, as a commercially available macromonomer suitably used in the synthesis of a dispersing resin, AA-6 (Product name, manufactured by Toagosei Co., Ltd.), AA-10 (Product name, manufactured by Toagosci Co., Ltd.), AB-6 (Product name, manufactured by Toagosci Co., Ltd.), AS-6 (Product name, manufactured by Toagosei Co., Ltd.), AN-6 (Product name, manufactured by Toagosei Co., Ltd.), AW-6 (Product name, manufactured by Toagosei Co., Ltd.), AA-714 (Product name, manufactured by Toagosei Co., Ltd.), AY-707 (Product name, manufactured by Toagosei Co., Ltd.), AY-714 (Product name, manufactured by Toagosei Co., Ltd.), AK-5 (Product name, manufactured by Toagosei Co., Ltd.), AK-30 (Product name, manufactured by Toagosei Co., Ltd.), AK-32 (Product name, manufactured by Toagosei Co., Ltd.), BLEMMER PP-100 (Product name, manufactured by NOF Corporation), BLEMMER PP-500 (Product name, manufactured by NOF Corporation), BLEMMER PP-800 (Product name, manufactured by NOF Corporation), BLEMMER PP-1000 (Product name, manufactured by NOF Corporation), BLEMMER 55-PET-800 (Product name, manufactured by NOF Corporation), BLEMMER PME-4000 (Product name, manufactured by NOF Corporation), BLEMMER PSE-400 (Product name, manufactured by NOF Corporation), BLEMMER PSE-1300 (Product name, manufactured by NOF Corporation), BLEMMER 43 PAPE-600B (Product name, manufactured by NOF Corporation), and the like are used. Among these, AA-6 (Product name, manufactured by Toagosei Co., Ltd.), AA-10 (Product name, manufactured by Toagosei Co., Ltd.), AB-6 (Product name, manufactured by Toagosei Co., Ltd.), AS-6 (Product name, manufactured by Toagosei Co., Ltd.), AN-6 (Product name, manufactured by Toagosei Co., Ltd.), BLEMMER PME-4000 (Product name, manufactured by NOF Corporation), and the like are preferably used.

The dispersing resin preferably includes a structural unit represented by any one of Formulae (1) to (4) below, as the structural unit having a graft chain and more preferably includes structural units represented by any one of Formula (1A) below, Formula (2A) below, Formula (3A) below, Formula (3B) below, and Formula (4) below.

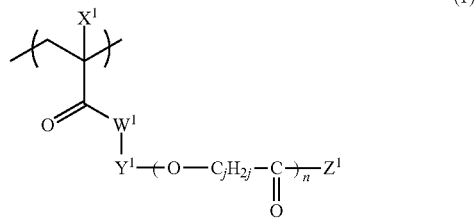

(1)

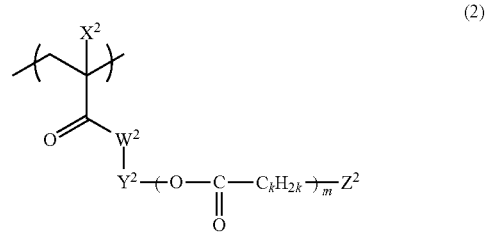

(2)

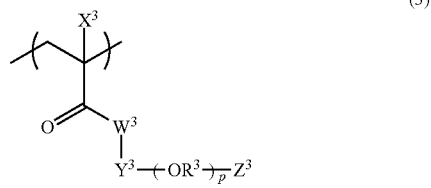

(3)

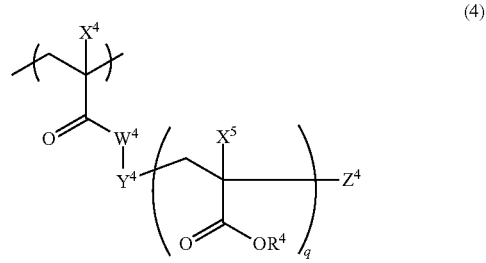

(4)

In Formulae (1) to (4), $W^1$, $W^2$, $W^3$, and $W^4$ each independently represent an oxygen atom or NH. $W^1$, $W^2$, $W^3$, and $W^4$ are preferably oxygen atoms.

In Formulae (1) to (4), $X^1$, $X^2$, $X^3$, $X^4$, and $X^5$ each independently represent a hydrogen atom or a monovalent organic group. In view of restriction on synthesis, it is preferable that $X^1$, $X^2$, $X^3$, $X^4$, and $X^5$ are each independently a hydrogen atom or an alkyl group having 1 to 12 carbon atoms, it is more preferable that $X^1$, $X^2$, $X^3$, $X^4$, and $X^5$ are each independently a hydrogen atom or a methyl group, and it is particularly preferable that $X^1$, $X^2$, $X^3$, $X^4$, and $X^5$ are methyl groups.

In Formulae (1) to (4), $Y^1$, $Y^2$, $Y^3$, and $Y^4$ each independently represent a divalent linking group, and a linking group is not particularly restricted in a structure. Specific examples of the divalent linking groups represented by $Y^1$, $Y^2$, $Y^3$, and $Y^4$ include linking groups of (Y-1) to (Y-21) below. In the structure represented below, A and B respectively mean bonding sites to a left terminal group and a right terminal group in Formulae (1) to (4). Among the structures described below, for the simplicity of synthesis, (Y-2) or (Y-13) is more preferable.

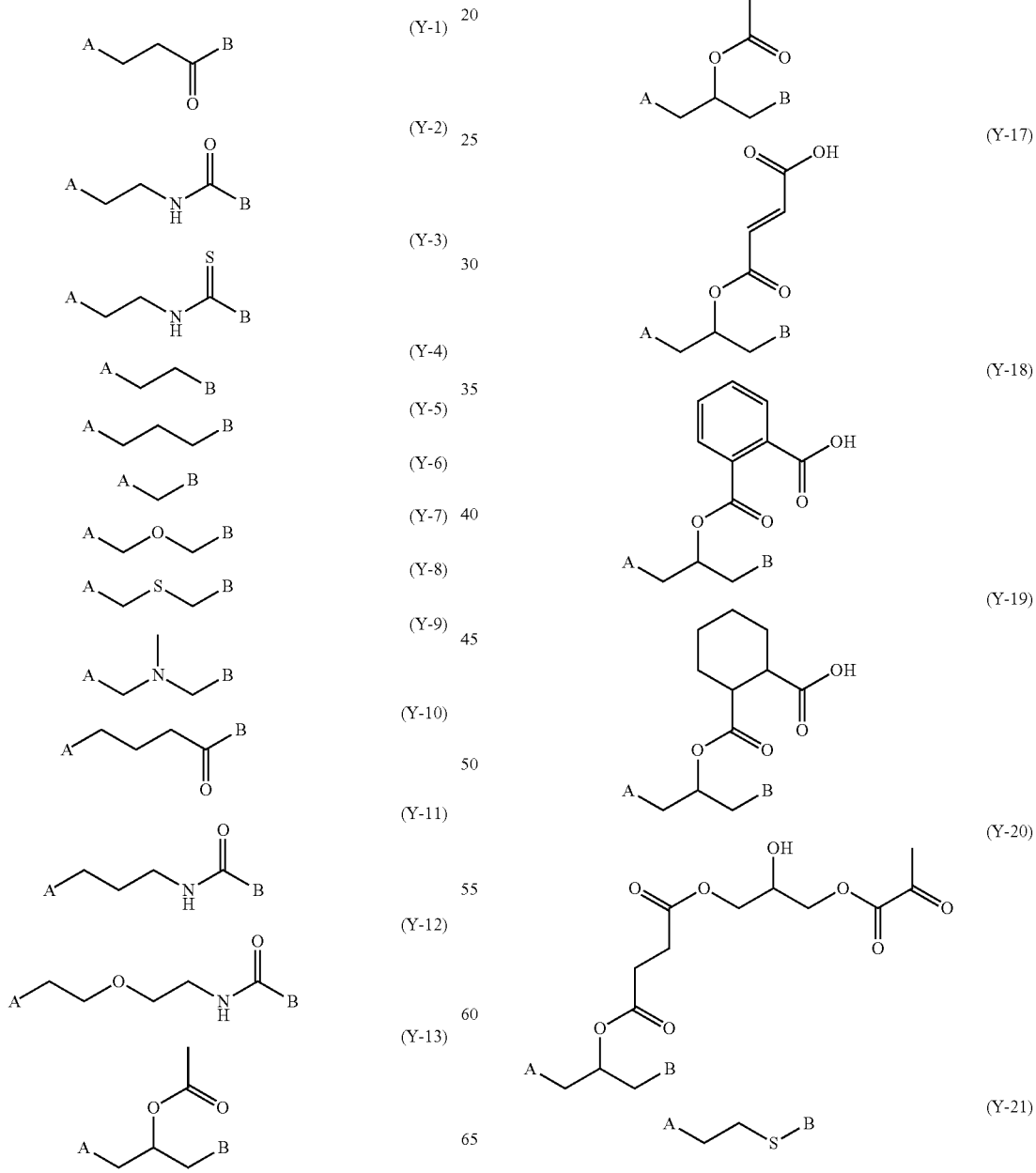

In Formulae (1) to (4), $Z^1$, $Z^2$, $Z^3$, and $Z^4$ each independently represent a monovalent organic group. A structure of the organic group is not particularly limited, but specific examples thereof include an alkyl group, a hydroxyl group, an alkoxy group, an aryloxy group, a heteroaryloxy group, an alkylthioether group, an arylthioether group, a heteroarylthioether group, and an amino group. Among these, as the organic groups represented by $Z^1$, $Z^2$, $Z^3$, and $Z^4$, particularly, in view of improvement of dispersibility, those having stereoscopic repulsion effects are preferable. It is preferable that the organic groups each independently represent an alkyl group having 5 to 24 carbon atoms. Among these, it is particularly preferable that the organic groups each independently represent a branched alkyl group having 5 to 24 carbon atoms or a cyclic alkyl group having 5 to 24 carbon atoms.

In Formulae (1) to (4), n, m, p, and q each are an integer of 1 to 500. In Formulae (1) and (2), j and k each independently represent an integer of 2 to 8. In view of dispersion stability and developability, j and k in Formulae (1) and (2) are preferably integers of 4 to 6 and most preferably 5.

In Formula (3), $R^3$ represents a branched or linear alkylene group, preferably an alkylene group having 1 to 10 carbon atoms, and more preferably an alkylene group having 2 or 3 carbon atoms. When p is 2 to 500, $R^3$'s which are plural may be identical to or different from each other.

In Formula (4), $R^4$ represents a hydrogen atom or a monovalent organic group, and a structure of this monovalent organic group is not particularly limited. Examples of $R^4$ preferably include a hydrogen atom, an alkyl group, an aryl group, and a heteroaryl group, and even more preferably a hydrogen atom or an alkyl group. In a case where $R^4$ is an alkyl group, the alkyl group is preferably a linear alkyl group having 1 to 20 carbon atoms, a branched alkyl group having 3 to 20 carbon atoms, or a cyclic alkyl group having 5 to 20 carbon atoms, more preferably a linear alkyl group having 1 to 20 carbon atoms, and particularly preferably a linear alkyl group having 1 to 6 carbon atoms. In Formula (4), when q is 2 to 500, $X^5$'s and $R^4$'s that are plural in a graft copolymer may be identical to or different from each other.

The dispersing resin may have a structural unit having two or more different structures and having a graft chain. That is, the molecule of the dispersing resin may include structural units represented by Formulae (1) to (4) having structures different from each other, in a case where n, m, p, and q in Formulae (1) to (4) each represent an integer of 2 or greater, in Formulae (1) and (2), j and k in a side chain may include structures different from each other, and in Formulae (3) and (4), $R^3$, $R^4$, and $X^5$ that are plural in the molecule may be identical to or different from each other.

As the structural unit represented by Formula (1), in view of dispersion stability and developability, a structural unit represented by Formula (1A) below is more preferable. As the structural unit represented by Formula (2), in view of dispersion stability and developability, a structural unit represented by Formula (2A) below is more preferable.

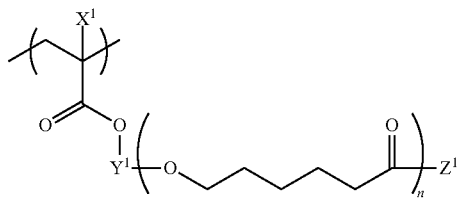

(1A)

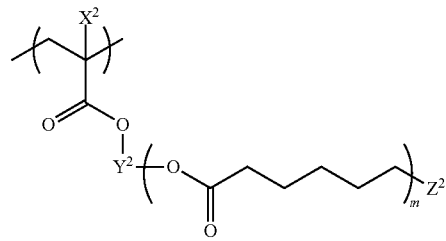

(2A)

In Formula (1A), $X^1$, $Y^1$, $Z^1$, and n have the same meaning as $X^1$, $Y^1$, $Z^1$, and n in Formula (1), and preferable scopes thereof are also the same. In Formula (2A), $X^2$, $Y^2$, $Z^2$, and m have the same meaning as $X^2$, $Y^2$, $Z^2$, and m in Formula (2), and preferable scopes thereof are also the same.

As the structural unit represented by Formula (3), in view of dispersion stability and developability, a structural unit represented by Formula (3A) or (3B) below is more preferable.

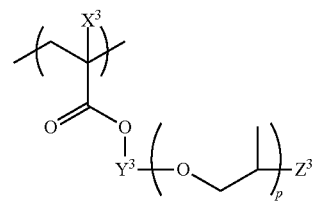

(3A)

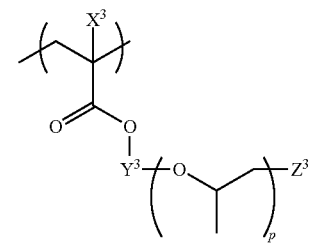

(3B)

In Formula (3A) or (3B), $X^3$, $Y^3$, $Z^3$, and p are the same as $X^3$, $Y^3$, $Z^3$, and p in Formula (3), and preferable scopes thereof are also the same.

As the structural unit having a graft chain, the dispersing resin more preferably has a structural unit represented by Formula (1A).

In the dispersing resin, a structural unit having a graft chain (a structural unit represented by Formula (1) to Formula (4)) is included preferably in the range of 10% to 90% and more preferably in the range of 30% to 70% with respect to a total mass of a dispersing resin, in terms of mass. When the structural unit having a graft chain is included in this range, dispersibility of a dispersoid is high, and developability when a light screening film is formed is satisfactory.

As described above, the dispersing resin preferably has a hydrophobic structural unit different from a structural unit having a graft chain (that is, not corresponding to a structural unit having a graft chain). However, according to the invention, the hydrophobic structural unit is a structural unit not having an acid group (for example, a carboxylic acid group, a sulfonic acid group, a phosphoric acid group, and a phenolic hydroxyl group).

The hydrophobic structural unit is preferably a structural unit derived from (corresponding to) a compound (monomer) having a ClogP value of 1.2 or greater and more preferably a structural unit derived from a compound having a ClogP value of 1.2 to 8. Accordingly, the effect of the invention can be more securely exhibited.

The dispersing resin preferably has one or more structural units selected from structural units derived from a monomer represented by Formulae (i) to (iii) below, as a hydrophobic structural unit.

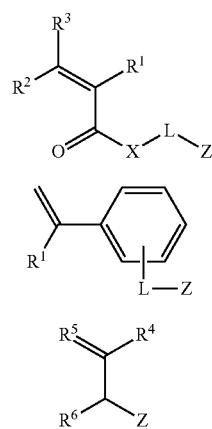

In Formulae (i) to (iii), $R^1$, $R^2$, and $R^3$ each independently represents a hydrogen atom, a halogen atom (for example, fluorine, chlorine, and bromine), or an alkyl group having 1 to 6 carbon atoms (for example, a methyl group, an ethyl group, and a propyl group; the same are applied below).

$R^1$, $R^2$, and $R^3$ are more preferably a hydrogen atom or an alkyl group having 1 to 3 carbon atoms and most preferably a hydrogen atom or a methyl group. $R^2$ and $R^3$ are particularly preferably a hydrogen atom. X represents an oxygen atom (—O—) or an imino group (—NH—) and preferably an oxygen atom.

L is a single bond or a divalent linking group. Examples of the divalent linking group include a divalent aliphatic group (for example, an alkylene group, a substituted alkylene group, an alkenylene group, a substituted alkenylene group, an alkynylene group, and a substituted alkynylene group), a divalent aromatic group (for example, an arylene group and a substituted arylene group), a divalent heterocyclic group, and a combination of these with an oxygen atom (—O—), a sulfur atom (—S—), an imino group (—NH—), a substituted imino group (—NR$^{31}$—, here, R$^{31}$ is an aliphatic group, an aromatic group, or a heterocyclic group) or a carbonyl group (—CO—).

The divalent aliphatic group may have a cyclic structure or a branched structure. The number of carbon atoms in an aliphatic group is preferably 1 to 20, more preferably 1 to 15, and even more preferably 1 to 10. The aliphatic group may be an unsaturated aliphatic group or may be a saturated aliphatic group. However, a saturated aliphatic group is preferable. The aliphatic group may have a substituent. Examples of the substituent include a halogen atom, an aromatic group, and a heterocyclic group.

The number of carbon atoms in a divalent aromatic group is preferably 6 to 20, more preferably 6 to 15, and most preferably 6 to 10. The aromatic group may have a substituent. Examples of the substituent include a halogen atom, an aliphatic group, an aromatic group, and a heterocyclic group.

The divalent heterocyclic group preferably has a 5-membered ring or a 6-membered ring as a heterocyclic ring. Another heterocyclic ring, an aliphatic ring, or an aromatic ring may be fused with the heterocyclic ring. The heterocyclic group may have a substituent. Examples of the substituent include a halogen atom, a hydroxyl group, an oxo group (=O), a thioxo group (=S), an imino group (=NH), a substituted imino group (=N—R$^{32}$, here, R$^{32}$ is an aliphatic group, an aromatic group, or a heterocyclic group), an aliphatic group, an aromatic group, and a heterocyclic group.

L is preferably a single bond, an alkylene group, or a divalent linking group including an oxyalkylene structure. The oxyalkylene structure is more preferably an oxyethylene structure or an oxypropylene structure. L may include a polyoxyalkylene structure including an oxyalkylene structure by repeating the oxyalkylene structure two or more times. As the polyoxyalkylene structure, a polyoxyethylene structure or a polyoxypropylene structure is preferable. The polyoxyethylene structure is represented by —(OCH$_2$CH$_2$) n-, n is preferably an integer of 2 or greater and more preferably an integer of 2 to 10.

Examples of Z include an aliphatic group (for example, an alkyl group, a substituted alkyl group, an unsaturated alkyl group, a substituted unsaturated alkyl group), an aromatic group (for example, an arylene group and a substituted arylene group), a heterocyclic group, and a combination of these with an oxygen atom (—O—), a sulfur atom (—S—), an imino group (—NH—), a substituted imino group (—NR$^{31}$—, here R$^{31}$ is an aliphatic group, an aromatic group, or a heterocyclic group), or a carbonyl group (—CO—).

An aliphatic group may have a cyclic structure or a branched structure. The number of carbon atoms in an aliphatic group is preferably 1 to 20, more preferably 1 to 15, and even more preferably 1 to 10. Further, examples of an aliphatic group include a ring-aggregated hydrocarbon group and a crosslinked cyclic hydrocarbon group. Examples of the ring-aggregated hydrocarbon group include a bicyclohexyl group, a perhydronaphthalenyl group, a biphenyl group, and a 4-cyclohexylphenyl group. Examples of the ring forming a crosslinked cyclic hydrocarbon group include a bicyclic hydrocarbon ring such as pinane, bornane, norpinane, norbornane, and a bicyclooctane ring (a bicyclo[2.2.2]octane ring, a bicyclo[3.2.1]octane ring, and the like), a tricyclic hydrocarbon ring such as homobledane, adamantane, tricyclo[5.2.1.0$^{2,6}$]decane, and tricyclo[4.3.1.1$^{2,5}$]undecane ring, and a tetracyclic hydrocarbon ring such as tetracyclo[4.4.0.1$^{2,5}$.1$^{7,10}$]dodecane, and a perhydro-1,4-methano-5,8-methanonaphthalene ring. Examples of a ring forming a crosslinked cyclic hydrocarbon group include a fused ring-type hydrocarbon ring, for example, a fused ring in which plural 5-membered to 8-membered cycloalkane rings such as perhydronaphthalene (decalin), perhydroanthracene, perhydrophenanthrene, perhydroacenaphthene, perhydrofluorene, perhydroindene, and perhydrophenalene rings are fused.

The aliphatic group is preferably a saturated aliphatic group rather than an unsaturated aliphatic group. The aliphatic group may have a substituent. Examples of the substituent include a halogen atom, an aromatic group, and a heterocyclic group. However, an aliphatic group does not have an acid group as a substituent.

The number of carbon atoms of the aromatic group is preferably 6 to 20, even more preferably 6 to 15, and most preferably 6 to 10. The aromatic group may have a substituent. Examples of the substituent include a halogen atom, an aliphatic group, an aromatic group, and a heterocyclic group. However, the aromatic group does not have an acid group as a substituent.

The heterocyclic group preferably has a 5-membered ring or a 6-membered ring as a heterocyclic ring. Another heterocyclic ring, an aliphatic ring, or an aromatic ring may be fused with the heterocyclic ring. The heterocyclic group may have a substituent. Examples of the substituent include a halogen atom, a hydroxyl group, an oxo group (=O), a thioxo group (=S), an imino group (=NH), a substituted imino group (=N—$R^{32}$, here, $R^{32}$ refers to an aliphatic group, an aromatic group, or a heterocyclic group), an aliphatic group, an aromatic group, and a heterocyclic group. However, a heterocyclic group does not have an acid group as a substituent.

In Formula (iii) above, $R^4$, $R^5$, and $R^6$ each independently represent a hydrogen atom, a halogen atom (for example, fluorine, chlorine, and bromine), an alkyl group having 1 to 6 carbon atoms, Z, or -L-Z. Here, L and Z have the same meanings as above. As $R^4$, $R^5$, and $R^6$, a hydrogen atom, or an alkyl group having 1 to 3 carbon atoms is preferable, and a hydrogen atom is more preferable.

According to the invention, as the monomer represented by Formula (i) above, a compound in which $R^1$, $R^2$, and $R^3$ represent hydrogen atoms or methyl groups, L represents an alkylene group or a divalent linking group including an oxyalkylene structure, X represents an oxygen atom or an imino group, and Z represents an aliphatic group, a heterocyclic group, or an aromatic group is preferable.

As the monomer represented by Formula (ii) above, a compound in which $R^1$ represents a hydrogen atom or a methyl group, L represents an alkylene group, Z represents an aliphatic group, a heterocyclic group, or an aromatic group, and Y represents a methine group is preferable. As the monomer represented by Formula (iii) above, a compound in which $R^4$, $R^5$, and $R^6$ represent hydrogen atoms or methyl groups, Z represents an aliphatic group, a heterocyclic group, or an aromatic group is preferable.

Examples of a representative compound represented by Formula (i) to (iii) include radical polymerizable compounds selected from acrylic acid esters, methacrylic acid esters, and styrenes.

Specific examples of the radical polymerizable compound include definitions disclosed in paragraphs 0069 to 0071 of JP2010-106268A (paragraphs 0113 to 0114 of corresponding US2011-0124824A), and these contents are incorporated into this specification.

Among these radical polymerizable compounds, methacrylic acid esters and styrenes are suitably used, and benzyl methacrylate, t-butyl methacrylate, 4-t-butylphenyl methacrylate, pentachlorophenyl methacrylate, 4-cyanophenyl methacrylate, cyclohexyl methacrylate, ethyl methacrylate, 2-ethylhexyl methacrylate, isobornyl methacrylate, isopropyl methacrylate, methyl methacrylate, 3,5-dimethyladamantyl methacrylate, 2-naphthyl methacrylate, neopentyl methacrylate, phenyl methacrylate, tetrahydrofurfuryl methacrylate, allyl methacrylate, styrene, methylstyrene, dimethylstyrene, trimethylstyrene, isopropylstyrene, butylstyrene, cyclohexylstyrene, chloromethylstyrene, trifluoromethylstyrene, ethoxymethylstyrene, acetoxymethylstyrene, methoxystyrene, 4-methoxy-3-methylstyrene, chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, 4-fluoro-3-trifluoromethylstyrene, 1-vinylnaphthalene, and 2-vinylnaphthalene are particularly suitably used.

Examples of the compound containing a heterocyclic group in the monomer corresponding to the hydrophobic structural unit include compounds described below.

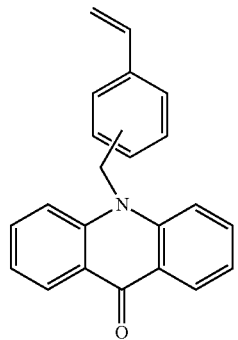

M-1

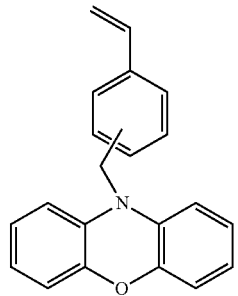

M-2

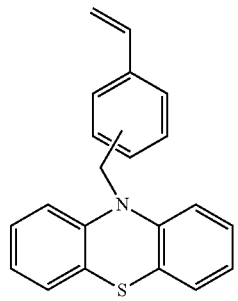

M-3

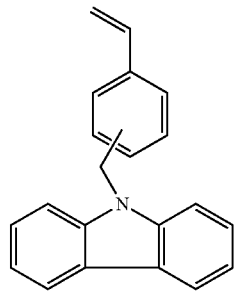

M-4

M-5
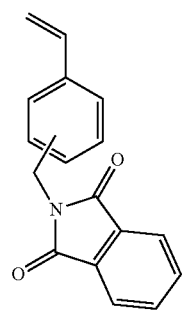
M-6
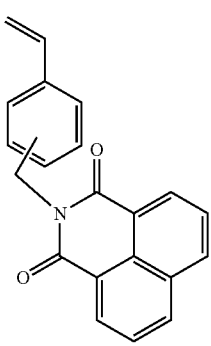
M-7
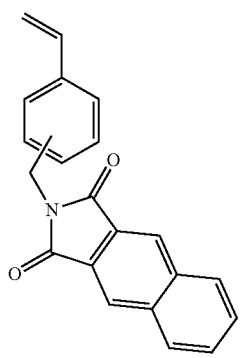
M-8
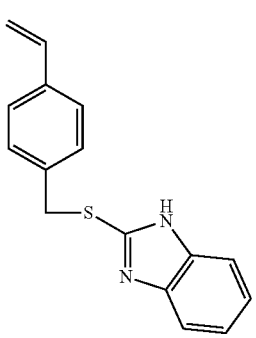
M-9
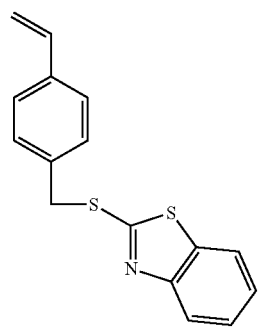
M-10
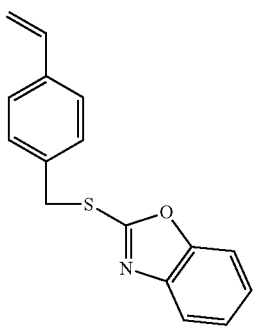
M-11
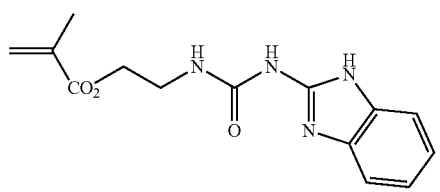
M-12
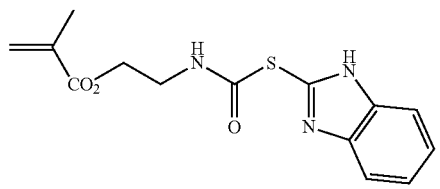
M-13
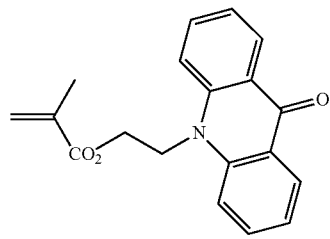
M-14
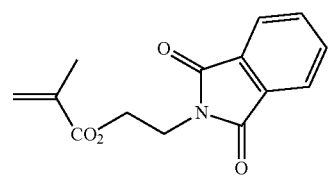
M-15

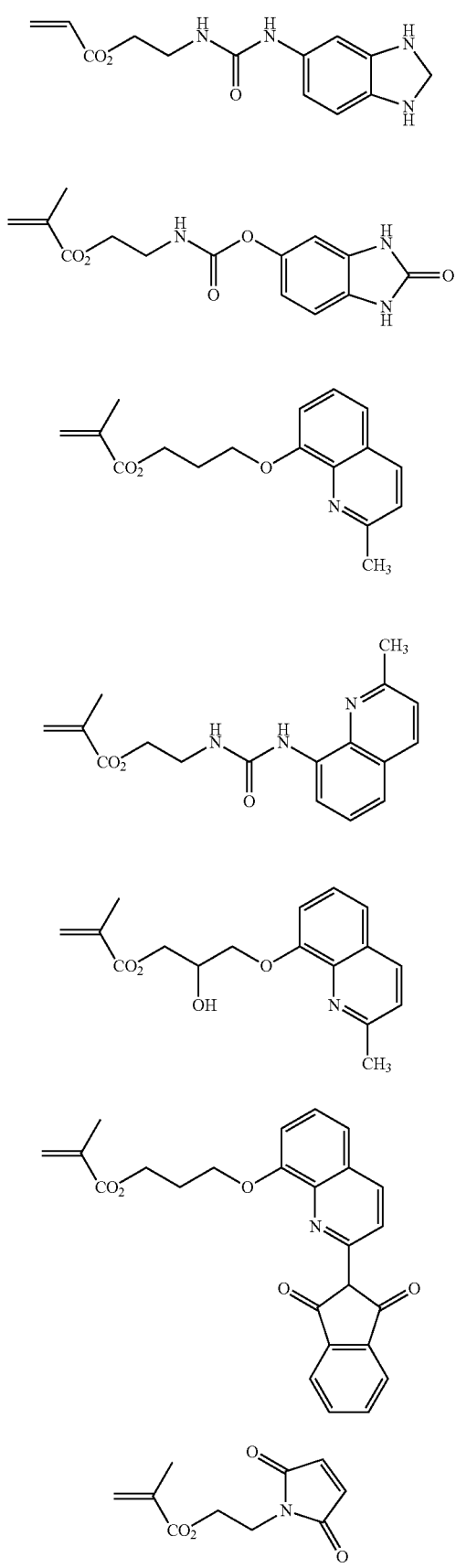
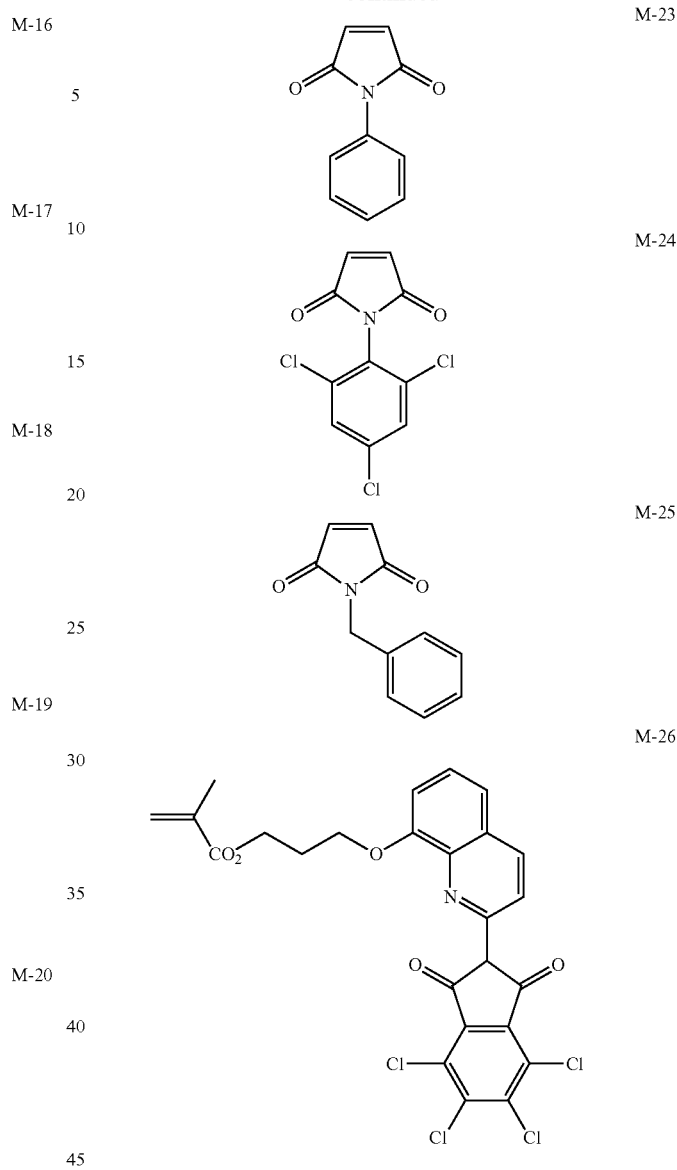

In the dispersing resin, the hydrophobic structural unit is included preferably in the range of 10% to 90% and more preferably in the range of 20% to 80%, with respect to a total mass of a dispersing resin, in terms of mass.

The dispersing resin can introduce a functional group that can form an interaction with a dispersoid. Here, the dispersing resin preferably has a structural unit having a functional group that forms an interaction with a dispersoid. Examples of this functional group that forms an interaction with a dispersoid include an acid group, a basic group, a coordinating group, and a functional group having reactivity.

In a case where a dispersing resin has an acid group, a basic group, a coordinating group, or a functional group having reactivity, each of those preferably has a structural unit having an acid group, a structural unit having a basic group, a structural unit having a coordinating group, or a structural unit having reactivity. Particularly, it is possible to cause the dispersing resin to have developability for forming a pattern due to alkali development, by causing the dispersing resin to further have an alkali soluble group such as a carboxylic acid group as an acid group. That is, if an alkali soluble group is introduced to the dispersing resin, the dispersing resin can have alkali solubility. The composition containing such a dispersing resin have more excellent light screening properties of an exposed portion and alkali developability of an unexposed portion is more improved.

If the dispersing resin has a structural unit having an acid group, the dispersing resin is easily harmonized with a solvent, and coating properties also tends to be improved. This causes an acid group in a structural unit having an acid group to easily interact with a dispersoid, and causes the dispersing resin to allow stable dispersion of a dispersoid.

However, the structural unit having an alkali soluble group as an acid group may have the same structural unit as the structural unit having the graft chain or may be a different structural unit. However, the structural unit that has an alkali soluble group as an acid group is a structural unit different from the hydrophobic structural unit (that is, does not correspond to the hydrophobic structural unit described above).

Examples of an acid group which is a functional group that forms an interaction with a dispersoid include a carboxylic acid group, a sulfonic acid group, a phosphoric acid group, and a phenolic hydroxyl group. Among these, at least one of a carboxylic acid group, a sulfonic acid group, or a phosphoric acid group is preferable, and a carboxylic acid group that has satisfactory absorbing power to a dispersoid and high dispersibility is particularly preferable.

That is, it is preferable that the dispersing resin further has a structural unit having at least one of a carboxylic acid group, a sulfonic acid group, or a phosphoric acid group.

The dispersing resin may have one or two or more structural units having an acid group. The dispersing resin may not contain a structural unit having an acid group. However, in a case where the dispersing resin contains the structural unit, content of the structural unit having an acid group is preferably 5% to 80% and more preferably 10% to 60% in view of suppression of damage in an image intensity due to alkali development, with respect to a total mass of the dispersing resin, in terms of mass.

Examples of the basic group that is a functional group that forms an interaction with a dispersoid include a primary amino group, a secondary amino group, a tertiary amino group, a heterocyclic ring including N atoms, and an amido group, and a particularly preferable basic group is a tertiary amino group having satisfactory absorbing power to carbon black and high dispersibility. The dispersing resin may have one or two or more of these basic groups.

The dispersing resin may not contain a structural unit having a basic group. However, in a case where the dispersing resin contains the structural unit, the content of the structural unit having a basic group is preferably 0.01% to 50%, and more preferably 0.01% to 30% in view of developability inhibition suppression, with respect to a total mass of the dispersing resin in terms of mass.

Examples of the coordinating group which is a functional group that forms an interaction with a dispersoid and a functional group that has reactivity include an acetylacetoxy group, a trialkoxysilyl group, an isocyanate group, acid anhydride, and acid chloride. A particularly preferable coordinating group and a functional group having reactivity are an acetylacetoxy group that has satisfactory absorbing power to a dispersoid and high dispersibility. The dispersing resin may have one of these groups or one or more of these groups.

The dispersing resin may not contain the structural units having a coordinating group or a structural unit having a functional group having reactivity. However, in a case where the dispersing resin contains the structural units, the content of these structural units is preferably 10% to 80% and more preferably 20% to 60% in view of developability inhibition suppression, with respect to a total mass of the dispersing resin in terms of mass.

In addition to a graft chain, in a case where the dispersing resin according to the invention has a functional group that forms an interaction with a dispersoid, a way how these functional groups are introduced is not particularly limited. However, the dispersing resin preferably has one or more structural units selected from structural units derived from monomers represented by Formulae (iv) to (vi) below.

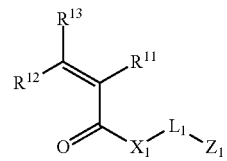

(iv)

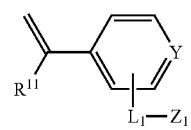

(v)

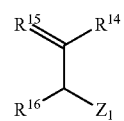

(vi)

In Formulae (iv) to (vi), $R^{11}$, $R^{12}$, and $R^{13}$ each independently represent a hydrogen atom, a halogen atom (for example, a fluorine atom, a chlorine atom, and a bromine atom), or an alkyl group having 1 to 6 carbon atoms.

In Formulae (iv) to (vi), it is more preferable that $R^{11}$, $R^{12}$, and $R^{13}$ are each independently a hydrogen atom or an alkyl group having 1 to 3 carbon atoms, and it is most preferable that $R^{11}$, $R^{12}$, and $R^{13}$ are each independently a hydrogen atom or a methyl group. In Formula (iv), it is particularly preferable that $R^{12}$ and $R^{13}$ are each independently a hydrogen atom.

$X_1$ in Formula (iv) is represents an oxygen atom (—O—) or an imino group (—NH—) and preferably an oxygen atom. Y in Formula (v) represents a methine group or a nitrogen atom.

$L_1$ in Formulae (iv) to (v) represents a single bond or a divalent linking group. Examples of the divalent linking group include a divalent aliphatic group (for example, an alkylene group, a substituted alkylene group, an alkenylene group, a substituted alkenylene group, an alkynylene group, and a substituted alkynylene group), a divalent aromatic group (for example, an arylene group and a substituted arylene group), a divalent heterocyclic group and a combination of these with one or more of an oxygen atom (—O—), a sulfur atom (—S—), an imino group (—NH—), a substituted imino bond (—$NR^{31'}$—, here, $R^{31'}$ represents an aliphatic group, an aromatic group, or a heterocyclic group), or a carbonyl bond (—CO—).

Definitions of the divalent aliphatic group, the divalent aromatic group, and the divalent heterocyclic group are the same as the definitions of respective groups represented by L above.

A suitable aspect of $L_1$ is the same as the suitable aspect of L described above.

In Formulae (iv) to (vi), $Z_1$ represents a functional group that forms an interaction with a dispersoid except for a graft site, and a carboxylic acid group and a tertiary amino group are preferable, and a carboxylic acid group is more preferable.

In Formula (vi), $R^{14}$, $R^{15}$, and $R^{16}$ each independently represent a hydrogen atom, a halogen atom (for example, fluorine, chlorine, and bromine), an alkyl group having 1 to 6 carbon atoms, —$Z_1$, or -$L_1$-$Z_1$. Here, $L_1$ and $Z_1$ are the same as $L_1$ and $Z_1$ above, and preferable examples thereof are also the same. It is preferable that $R^{14}$, $R^{15}$, and $R^{16}$ each independently represent a hydrogen atom or an alkyl group having 1 to 3 carbon atoms and it is more preferable that $R^{14}$, $R^{15}$, and $R^{16}$ each independently represent a hydrogen atom.

According to the invention, as the monomer represented by Formula (iv), a compound in which $R^{11}$, $R^{12}$, and $R^{13}$ each independently represent a hydrogen atom or a methyl group, $L_1$ represents an alkylene group or a divalent linking group including an oxyalkylene structure, $X_1$ represents an oxygen atom or an imino group, and $Z_1$ represents a carboxylic acid group is preferable.

As the monomer represented by Formula (v), a compound in which $R^{11}$ represents a hydrogen atom or a methyl group, $L_1$ represents an alkylene group, $Z_1$ represents a carboxylic acid group, and Y represents a methine group is preferable.

As the monomer represented by Formula (vi), a compound in which $R^{14}$, $R^{15}$, and $R^{16}$ each independently represent a hydrogen atom or a methyl group, and $Z_1$ represents a carboxylic acid group is preferable.

Representative examples of the monomers (compounds) represented by Formulae (iv) to (vi) are provided below. Examples of the monomer include methacrylic acid, crotonic acid, isocrotonic acid, a reactant of a compound having an addition polymerizable double bond and a hydroxyl group in a molecule (for example, 2-hydroxyethyl methacrylate) and succinic anhydride, a reactant of a compound having an addition polymerizable double bond and a hydroxyl group in a molecule and phthalic anhydride, a reactant of a compound having an addition polymerizable double bond and a hydroxyl group in a molecule and tetrahydroxy phthalic anhydride, a reactant of a compound having an addition polymerizable double bond and a hydroxyl group in a molecule and trimellitic anhydride, a reactant of a compound having an addition polymerizable double bond and a hydroxyl group in a molecule and pyromellitic anhydride, acrylic acid, an acrylic acid dimer, an acrylic acid oligomer, maleic acid, itaconic acid, fumaric acid, 4-vinylbenzoic acid, vinylphenol, and 4-hydroxyphenylmethacrylamide.

In view of an interaction with a dispersoid, dispersion stability, and permeation to a developer, a content of a functional group that forms an interaction with a dispersoid is preferably 0.05 mass % to 90 mass %, more preferably 1.0 mass % to 80 mass %, and even more preferably 10 mass % to 70 mass %, with respect to a total mass of a dispersing resin.

For the purpose of improving the entire characteristics such as image intensity, without deteriorating the effects of the invention, the dispersing resin may further have other structural units having various functions (for example, a structural unit having a functional group having affinity with a dispersion medium used in a dispersoid), different from a structural unit having a graft chain, a hydrophobic structural unit, and a structural unit having a functional group that forms an interaction with a dispersoid.

Examples of these other structural units include a structural unit derived from a radical polymerizable compound selected from acrylonitriles and methacrylonitriles.

As the dispersing resin, one or two or more of these other structural units can be used, and the content thereof is preferably 0% to 80% and particularly preferably 10% to 60% with respect to a total mass of the dispersing resin in terms of mass. If the content is in the range described above, sufficient pattern forming properties are maintained.

The acid value of the dispersing resin is preferably in the range of 0 to 160 mg KOH/g, more preferably in the range of 10 to 140 mg KOH/g, and even more preferably in the range of 20 to 120 mg KOH/g.

If the acid value of the dispersing resin is 160 mg KOH/g or lower, pattern peeling at the time of development when the light screening film is formed is more effectively suppressed. If the acid value of the dispersing resin is 10 mg KOH/g or greater, alkali developability becomes more satisfactory. If the acid value of the dispersing resin is 20 mg KOH/g or greater, precipitation of a dispersed material including carbon black, titanium black, or titanium black and an Si atom is more suppressed, the number of coarse particles can be further reduced, and temporal stability of the composition can be further improved.

For example, the acid value of the dispersing resin can be calculated from an average content of the acid group in the dispersing resin. It is possible to obtain a resin having a desired acid value by changing the content of the structural unit containing the acid group in the dispersing resin.

When the light screening film is formed, in view of pattern peeling suppression at the development and developability, a weight-average molecular weight of the dispersing resin is preferably 4,000 to 300,000, more preferably 5,000 to 200,000, even more preferably 6,000 to 100,000, and particularly preferably 10,000 to 50,000, in terms of polystyrene by a GPC method.

The GPC method is based on a method of using HLC-8020 GPC (manufactured by Tosoh Corporation), using TSKgel Super HZM-H, TSKgel Super HZ4000, and TSKgel Super HZ2000 (manufactured by Tosoh Corporation, 4.6 mmID×15 cm) as a column, and using tetrahydrofuran (THF) as a eluant.

Hereinafter, specific examples of the dispersing resin are provided, but the invention is not limited thereto. In the compound exemplified below, numerical values written together with respective structural units (numerical values written together with a main chain repeating unit) represent a content of a structural unit [described as mass % (wt %)]. The numerical values written together with a repeating site on a side chain represent a repetitive number of the repeating site.

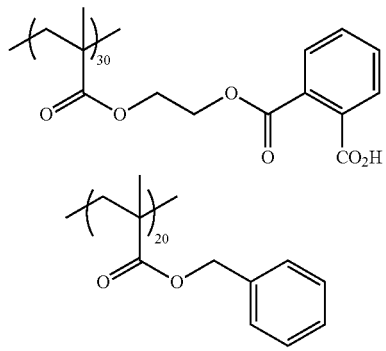

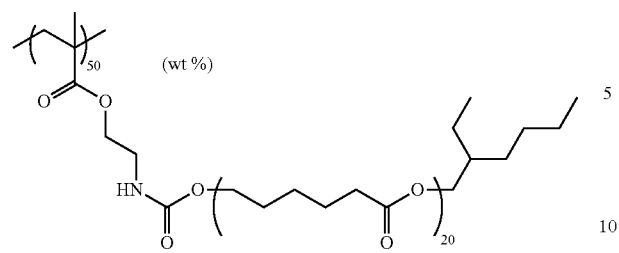
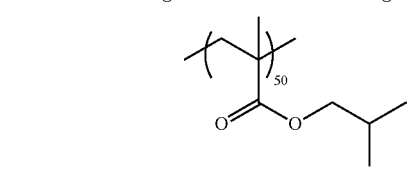
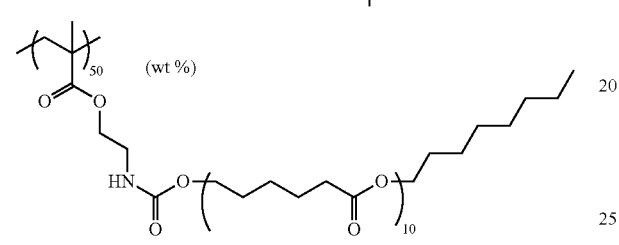
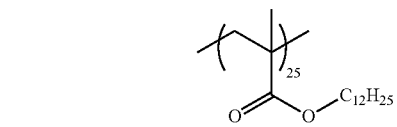
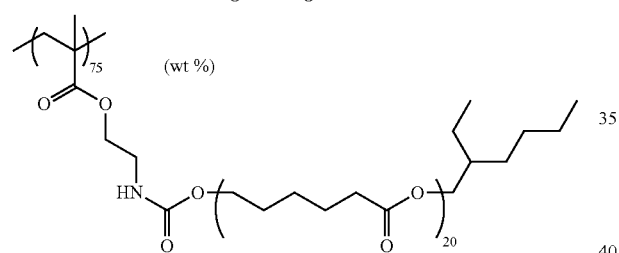
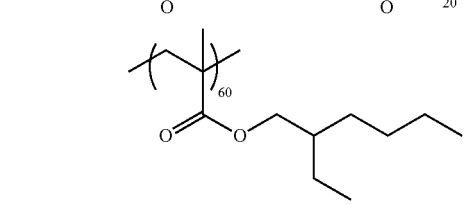
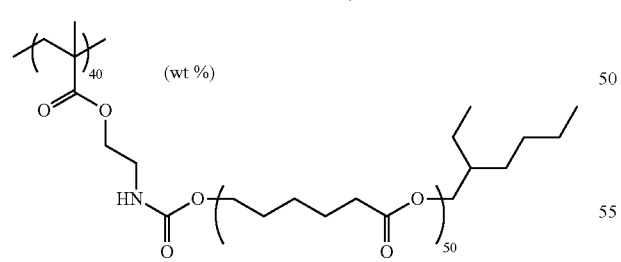
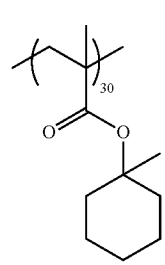
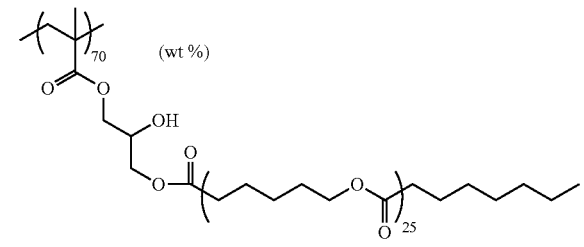
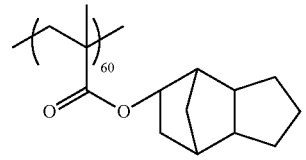
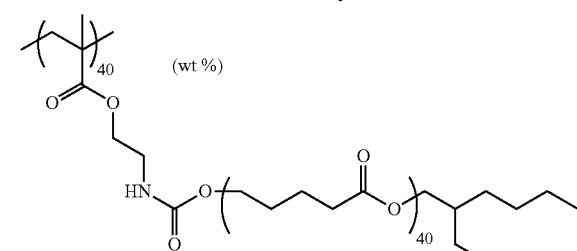
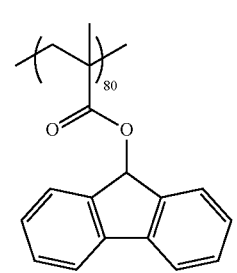
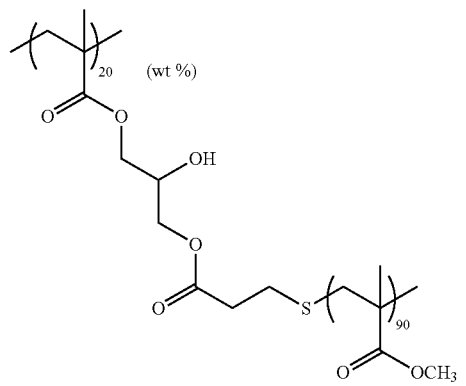
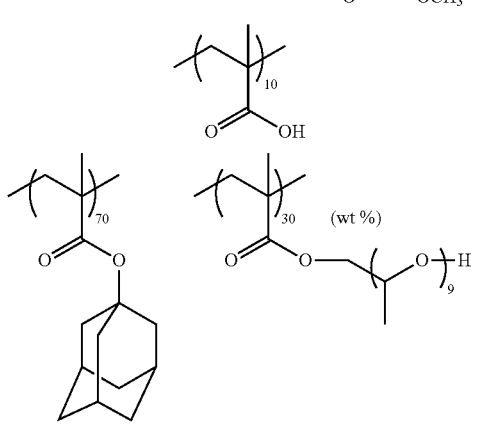

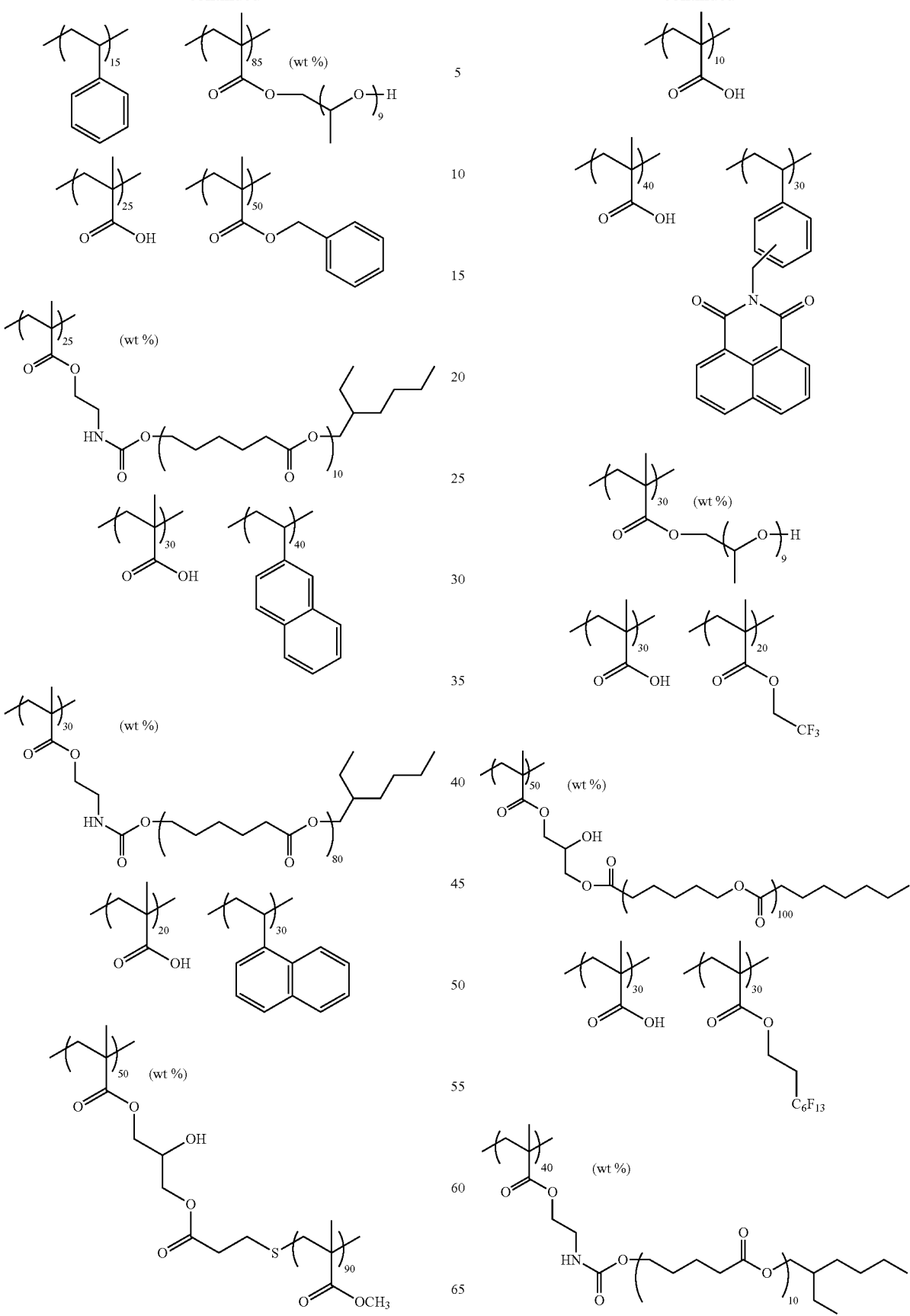

-continued
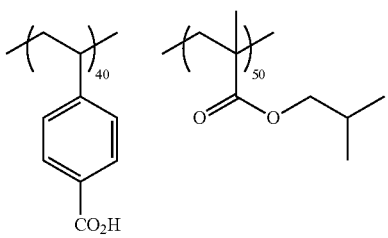
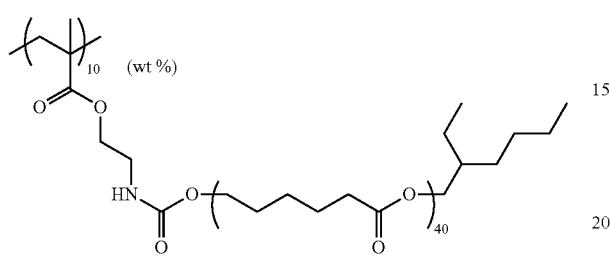
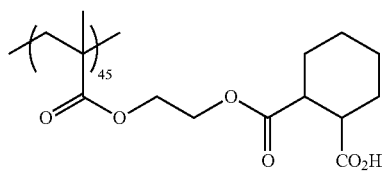
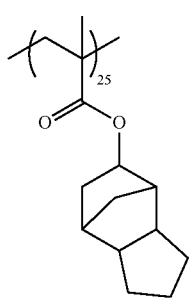
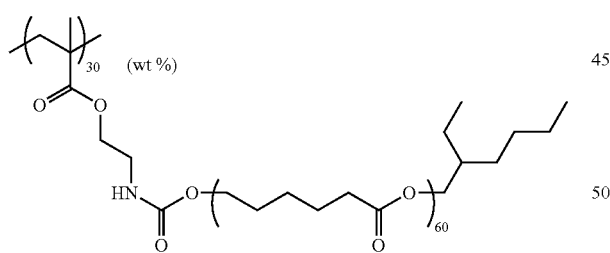
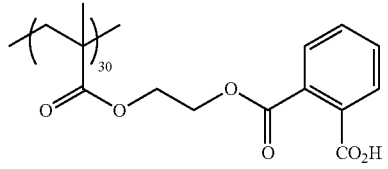
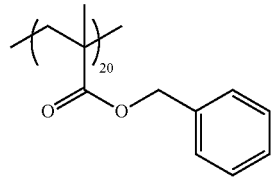
-continued
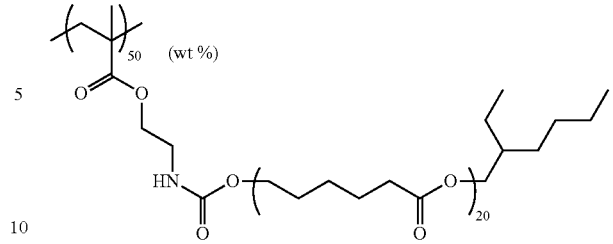
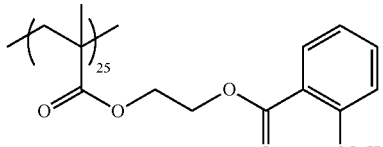
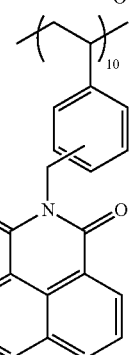
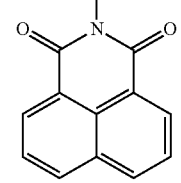
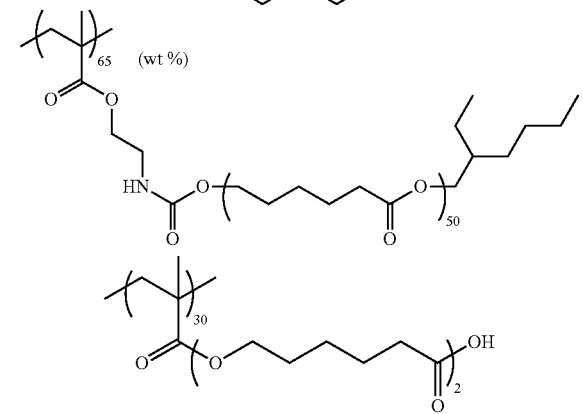
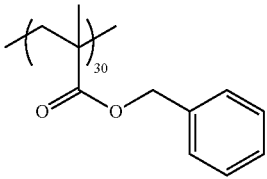
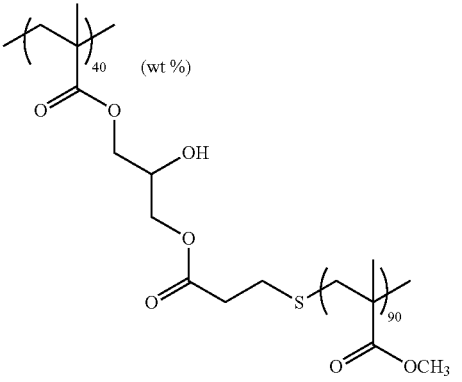

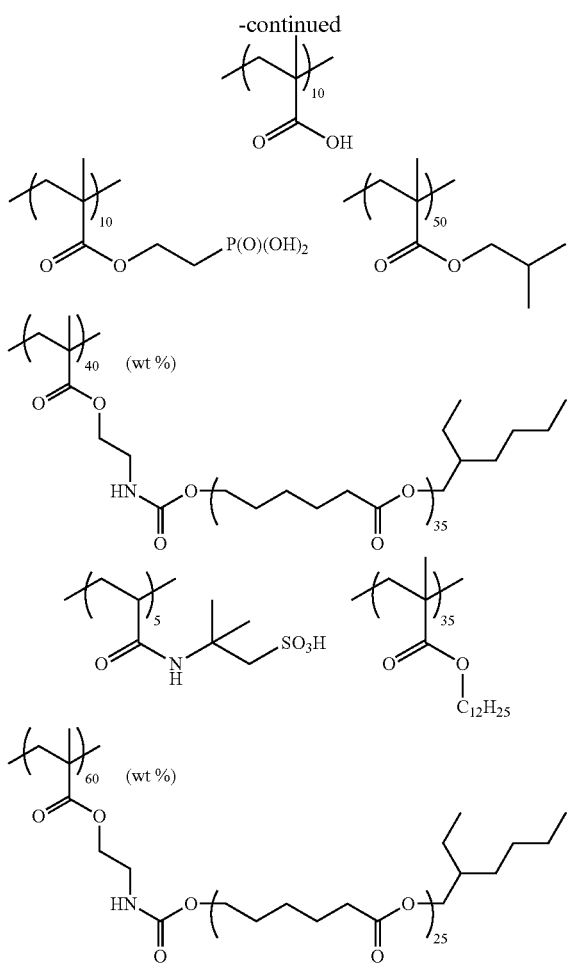

In addition to the above, specific examples of the dispersing resin include "Disperbyk-161, 162, 163, 164, 165, 166, and 170 (Product name, high molecular copolymer)" manufactured by BYK Chemie GmbH, and "EFKA4047, 4050, 4010, and 4165 (Product name, polyurethane-based), EFKA4330, and 4340 (Product name, block copolymer)" manufactured by E.W. Kaufmann Company. Examples thereof also include ACRYBASE FFS-6824 (manufactured by Fujikurakasei Co., Ltd.).

These dispersing resins may be used singly or two or more types thereof may be used in combination.

Since dispersion stability of a dispersoid or the like becomes more excellent and effects of the invention become more excellent, the content of the dispersing resin in the composition is preferably 1 to 90 mass %, more preferably 3 to 70 mass %, and even more preferably 5 to 30 mass % with respect to a total solid content in the composition.

((C) Binder Polymer)

For the purpose of improving coated film characteristics, the composition according to the invention includes a binder polymer.

The acid value of the used binder polymer is 50 mg KOH/g or less, preferably 20 to 50 mg KOH/g, and more preferably 25 to 35 mg KOH/g. The lower limit of the acid value is not particularly limited, but in view of lithographic performance, the lower limit is preferably 20 mg KOH/g or greater.

The acid value of the binder polymer according to the invention (unit: mg KOH/g) is an amount (mg) of potassium hydroxide (KOH) necessary for neutralizing 1 g of a binder polymer. The acid value according to the invention refers to a value measured by a method of Section 11.1 of JIS K 5407 (1990).

The weight-average molecular weight of the binder polymer is 8,000 to 50,000, preferably 8,000 to 30,000, and more preferably 12,000 to 18,000.

The measuring method of the weight-average molecular weight of the binder polymer is performed, for example, by directly connecting HPC-8220GPC (manufactured by Tosoh Corporation), guard column: TSK guard column Super HZ-L, column: TSKgel Super HZM-M, TSKgel Super HZ4000, TSKgel Super HZ3000, and TSKgel Super HZ2000, introducing 10 µl of a tetrahydrofuran solution at a column temperature of 40° C., and a sample concentration of 0.1 mass %, and flowing tetrahydrofuran as an elution solvent at a flow rate of 0.35 ml per minute, and detecting a sample peak with an RI detection device. A weight-average molecular weight was calculated by using a calibration curve created by using standard polystyrene.

The SP value of the binder polymer is not particularly limited. However, since effects of the invention become more excellent, an SP value is preferably 15 to 30 $(MPa)^{1/2}$ and more preferably 18 to 25 $(MPa)^{1/2}$.

An absolute value of a difference between the SP value of the dispersing resin and the SP value of the binder polymer (the SP value of the dispersing resin—the SP value of the binder polymer) is not particularly limited. However, since effects of the invention become more excellent, the difference thereof is preferably 3 $(MPa)^{1/2}$ or greater and more preferably 3 to 5 $(MPa)^{1/2}$.

The definition and the measuring method of the SP value are as described above.

As the binder polymer, it is preferable to use a linear organic polymer. As the "linear organic polymer", well-known polymers can be arbitrarily used. In order to cause water development or the development by alkaline water (preferably, weakly alkaline water) to become possible, a linear organic polymer soluble or swellable in water or alkaline water is preferably selected. The linear organic polymer is selectively used according to not only a coated film forming agent but also a developer (developing agent) consisting of water, alkaline water, or an organic solvent. For example, if a water-soluble organic polymer is used, water development becomes possible.

Examples of this linear organic polymer include a radical polymer having a carboxylic acid group in a side chain, for example, polymers disclosed in JP1984-44615A (JP-S59-44615A), JP1979-34327B (JP-S54-34327B), JP1983-12577B (JP-S58-12577B), JP1979-25957B (JP-S54-25957B), JP1979-92723A (JP-S54-92723A), JP1984-53836A (JP-S59-53836A), and JP1984-71048A (JP-S59-71048A), that is, a single substance of a monomer having a carboxyl group, a resin obtained by copolymerizing a monomer having a carboxyl group, a single substance of a monomer having acid anhydride, a resin obtained by copolymerizing a monomer having acid anhydride and hydrolyzing, half-esterifying, or half-amidating an acid anhydride unit, and epoxy acrylate obtained by modifying an epoxy resin with unsaturated monocarboxylic acid and acid anhydride. Examples of the monomer having a carboxyl group include acrylic acid, methacrylic acid, itaconic acid, crotonic acid, maleic acid, fumaric acid, and 4-carboxylstyrene, and examples of the monomer having acid anhydride include maleic anhydride. In the same manner, acidic cellulose derivative having a carboxylic acid group in a side chain is exemplified. In addition, monomers obtained by adding cyclic acid anhydride to a polymer having a hydroxyl group are useful.

Urethane-based binder polymers containing an acid group disclosed in JP1995-12004B (JP-H07-12004B), JP1995-120041 B (JP-H07-120041B), JP1995-120042B (JP-H07-120042B), JP1996-12424B (JP-H08-12424B), JP1988-287944A (JP-S63-287944A), JP1988-287947A (JP-S63-287947A), JP1989-271741A (JP-H01-271741A), and JP1998-116232 (JP-H10-116232) have extremely excellent strength, and thus are advantageous in view of suitability to low exposure.

Acetal modified polyvinylalcohol-based binder polymers having an acid group disclosed in EP993966B, EP1204000B, and JP2001-318463A have excellent balance of film hardness and developability, and thus are suitable. As the water-soluble linear organic polymer, polyvinylpyrrolidone, polyethylene oxide, or the like are also useful. In order to increase the strength of the hardened coated film, polyether of alcohol soluble nylon, 2,2-bis-(4-hydroxyphenyl)-propane and epichlorohydrin, or the like is useful.

Particularly, among these, a [benzyl(meth)acrylate/(meth) acrylic acid/another addition polymerizable vinyl monomer, if necessary] copolymer and an [allyl(meth)acrylate/(meth) acrylic acid/another addition polymerizable vinyl monomer, if necessary] copolymer have excellent balance in film hardness, sensitivity, and developability, and thus are suitable.

These binder polymers may be any one of a random polymer, a block polymer, and a graft polymer.

The binder polymer can be synthesized by a well-known method in the related art. Examples of the solvent used at the time of synthesis include tetrahydrofuran, ethylenedichloride, and cyclohexanone. These solvents may be used singly or two or more types thereof may be used in combination. Examples of the radical polymerization initiator used when the binder polymer is synthesized include well-known compounds such as an azo-based initiator and a peroxide initiator.

According to the invention, both of the curing properties of the exposed portion and the alkali developability of the unexposed portion can be particularly improved by using an alkali soluble resin having a double bond in a side chain as a binder polymer. If the alkali soluble resin having a double bond in a side chain has an acid group for causing a resin to be alkali-soluble and at least one unsaturated double bond in a structure thereof, the entire characteristics such as non-image area removability are improved. More specifically, a binder polymer having a repeating unit having an acid group and a repeating unit having an unsaturated double bond is preferable. The definition of the acid group is the same as the definition of the acid group in the dispersing resin described above. As the suitable aspect of the repeating unit having the unsaturated double bond, a repeating unit having a radical polymerizable group is preferable. Examples of the radical polymerizable group include a (meth)acryloyl group, a vinyl group, an acrylamido group, and methacrylimide, and a (meth)acryloyl group is preferable.

A hydrophobic structural unit described in the dispersing resin section may be included in the binder polymer. Examples of the suitable aspect of the hydrophobic structural unit include structural units derived from the monomers represented by Formulae (i) to (iii) described in the dispersing resin section.

In a case where the repeating unit having the acid group is included in the binder polymer, the content is preferably 5 to 30 mol % and more preferably 5 to 20 mol % with respect to the entire repeating units, since effects of the invention become more excellent.

In a case where the repeating unit having the unsaturated double bond is included in the binder polymer, the content thereof is preferably 10 to 50 mol % and more preferably 20 to 40 mol % with respect to the entire repeating units, since effects of the invention become more excellent.

In a case where the hydrophobic structural unit is included in the binder polymer, the content thereof is preferably 5 to 60 mol % and more preferably 10 to 40 mol % with respect to the entire repeating units, since effects of the invention become more excellent.

A resin having this structure is specifically disclosed in JP2003-262958A, and resins disclosed therein can be used as a binder polymer.

As the binder polymer, a cardo resin can be used, and a cardo resin that is selected from a group consisting of an epoxy resin, a polyester resin, a polycarbonate resin, an acryl resin, a polyether resin, a polyamide resin, a polyurea resin, and a polyimide resin and that has a fluorene skeleton is preferable. Here, the cardo resin refers to a resin having a cardo structure (a skeleton structure in which two cyclic structures are bonded to quaternary carbon atoms that form a cyclic structure) in a molecule. More specifically, compounds disclosed in [0046] to [0057] of JP2011-170334A can be used.

Examples of one of the suitable aspect of the binder polymer include CYCLOMER P(ACA)230AA, ACA210β, 200M, Z250, Z251, Z300, and Z320 manufactured by Daicel-Allnex Ltd. Examples thereof include ACRYCURE RD-F8 (Nippon Shokubai Co., Ltd.) and ACRYBASE FF-187 (Fujikurakasci Co., Ltd.).

Since effects of the invention become more excellent, the content of the binder polymer in the composition is preferably 4 to 30 mass %, more preferably 7 to 30 mass %, even more preferably 12 to 25 mass %, and particularly preferably 15 to 25 mass % with respect to a total solid content in the composition.

((D) Polymerizable Compound)

A compound that has at least one addition-polymerizable ethylenically unsaturated group, and has a boiling point of 100° C. or higher under normal pressure is preferable as the polymerizable compound.

Examples of the compound that has at least one addition-polymerizable ethylenically unsaturated group and that has a boiling point of 100° C. or higher under normal pressure include monofunctional acrylate or methacrylate such as polyethylene glycol mono(meth)acrylate, polypropylene glycol mono(meth)acrylate, or phenoxyethyl(meth)acrylate; polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol hexa(meth)acrylate, hexanediol (meth)acrylate, and trimethylolpropane tri(acryloyloxypropyl)ether, tri(acryloyloxyethyl)isocyanurate, a compound (meth)acrylated after ethylene oxide or propylene oxide is added to polyfunctional alcohol such as glycerine or trimethylolethane, poly(meth)acrylated compounds of pentaerythritol or dipentaerythritol, urethaneacrylates disclosed in JP1973-41708B (JP-S48-41708B), JP1975-6034B (JP-S50-6034B), and JP1976-37193A (JP-S51-37193A), polyesteracrylates disclosed in JP1973-64183A (JP-S48-64183A), JP1974-43191B (JP-S49-43191B), and JP1977-30490B (JP-S52-30490B), and polyfunctional acrylate or methacrylate such as epoxy acrylates that is a reaction product between an epoxy resin and (meth)acrylic acid. Compounds introduced as a photocurable monomer and a photocurable oligomer in Adhesion Society of Japan, Vol. 20, No. 7, pages 300 to 308 can also be used.

A compound (meth)acrylated after ethylene oxide or propylene oxide is added to polyfunctional alcohol that is disclosed together with Formulae (1) and (2) and specific examples thereof in JP1998-62986A (JP-H10-62986A) can be used.

Among these, a structure in which dipentaerythritol penta (meth)acrylate, dipentaerythritol hexa(meth)acrylate, and acryloyl groups thereof are linked to dipentaerythritol via an ethylene glycol residue or a propylene glycol residue is preferable. An oligomer type of these can also be used.

Among these polymerizable compounds, examples of a bifunctional compound include NK ESTER A-BPE-20 manufactured by Shin-Nakamura Chemical Co., Ltd. and LITEACRYLATE DCP-A manufactured by Kyoeisha Chemical Co., Ltd., examples of trifunctional and tetrafunctional mixtures include ARONLX M-305 and M-510 manufactured by Toagosei Co., Ltd., examples of tetrafunctional compounds include KAYARAD RP-1040 manufactured by Nippon Kayaku Co., Ltd., and NK ESTER A-TMMT manufactured by Shin-Nakamura Chemical Co., Ltd., examples of pentafunctional and hexafunctional mixtures include KAYARAD DPHA manufactured by Nippon Kayaku Co., Ltd., and examples of hexafunctional compounds include KAYARAD DPCA-20 manufactured by Nippon Kayaku Co., Ltd. and NK ESTER A-DPH-12E manufactured by Shin-Nakamura Chemical Co., Ltd.

Urethaneacrylates disclosed in JP1973-41708B (JP-S48-41708B), JP1976-37193A (JP-S51-37193A), JP1990-32293B (JP-H02-32293B), and JP1990-16765B (JP-H02-16765B) and urethane compounds having an ethylene oxide-based skeleton disclosed in JP1983-49860B (JP-S58-49860B), JP1991-17654B (JP-S56-17654B), JP1987-39417B (JP-S62-39417B), and JP1987-39418B (JP-S62-39418B) are suitable. If addition polymerizable compounds having an amino structure or a sulfide structure in a molecule thereof disclosed in JP1988-277653A (JP-S63-277653A), JP1988-260909A (JP-S63-260909A), and JP1989-105238A (JP-H01-105238A) are used, photopolymerizable compositions having an extremely excellent photosensitive speed can be obtained. Examples of the commercially available products include urethane oligomers UAS-10 and UAB-140 (Product name, manufactured by Nippon Paper Industries Co., Ltd.), UA-7200 (manufactured by Shin-Nakamura Chemical Co., Ltd.), DPHA-40H (Product name, manufactured by Nippon Kayaku Co., Ltd.), and UA-306H, UA-306T, UA-3061, AH-600, T-600, and AI-600 (Product name, manufactured by Kyoeisha Chemical Co., Ltd.).

Ethylenically unsaturated compounds having an acid group are also suitable, and examples of the commercially available product include carboxyl group-containing trifunctional acrylate TO-756 and carboxyl group-containing pentafunctional acrylate TO-1382 manufactured by Toagosei Co., Ltd.

As the polymerizable compound used in the invention, tetrafunctional or higher acrylate compounds are more preferable.

The polymerizable compounds may be used singly or two or more types thereof may be used in combination. In a case where two or more polymerizable compounds are combined to be used, the combination aspect thereof can be appropriately set according to physical properties required in the composition. Examples of one suitable combination aspect of the polymerizable compound include an aspect in which two or more polymerizable compounds selected from the aforementioned polyfunctional acrylate compounds are combined. Examples thereof include a combination of dipentaerythritol hexaacrylate and pentaerythritol triacrylate.

The content of the polymerizable compound in the composition is preferably 3 to 55 mass % and more preferably 10 to 50 mass % with respect to a total solid content in the composition.

(Other Components)

Components other than the light screening material, the dispersing resin, the binder polymer, the polymerizable compound may be included in the light screening composition. Examples thereof include a solvent, a polymerization initiator, a sensitizer, a polymerization inhibitor, an adhesion improver, and a surfactant.

Hereinafter, these arbitrary components are described.

((E) Solvent)

The composition according to the invention may contain a solvent.

The types of the solvent are not particularly limited, but the solvent is preferably an organic solvent.

Examples of the organic solvent include acetone, methylethylketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetonealcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethylsulfoxide, γ-butyrolactone, ethyl acetate, butyl acetate, methyl lactate, ethyl lactate, and the invention is not limited thereto.

The solvent may be used singly or two or more types thereof may be used in combination. In a case where two or more solvents are used in combination, the combination is particularly preferably formed with two or more solvents selected from methyl 3-ethoxypropionate, ethyl 3-ethoxypropionate, ethylcellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol methyl ether acetate.

In a case where the solvent is included in the composition, the content of the solvent included in the composition is not particularly limited. However, the content is preferably 10 to 80 mass %, more preferably 20 to 70 mass %, and even more preferably 30 to 65 mass % with respect to a total mass of the composition.

((F) Polymerization Initiator)

The composition according to the invention may contain a polymerization initiator (preferably, a photopolymerization initiator).

The polymerization initiator is a compound that is decomposed by light or heat and initiates and promotes polymerization of the polymerizable compound and is preferably a compound having adsorption to light in a wavelength range of 300 to 500 nm.

Specific examples of the polymerization initiator include an organic halogenated compound, an oxydiazole compound, a carbonyl compound, a ketal compound, a benzoin compound, organic peroxidated compound, an azo compound, a coumarin compound, an azide compound, a metallocene compound, an organic boric acid compound, a disulfonic acid compound, an oxime compound (particularly oxime ester compound), an onium salt compound, and an acyl phosphine (oxide) compound. Specific examples thereof include polymerization initiators disclosed in paragraph numbers [0081] to [0100], and [0101] to [0139] of JP2006-78749A. Among the polymerization initiators, since a shape of the obtained pattern can be improved, an oxime compound (particularly, an oxime ester compound) is more preferable. As the oxime compound, IRGACURE OXE01 and OXE02 manufactured by BASF SE is preferable. With OXE01 and OXE02, the same effect can be obtained.

In a case where a polymerization initiator is included in the composition, the content of the polymerization initiator in the composition is preferably 0.1 to 30 mass %, more preferably 1 to 25 mass %, and even more preferably 2 to 20 mass % with respect to a total solid content in the composition.

((G) Sensitizer)

For the purpose of improving radical generation efficiency of the polymerization initiator and causing a photosensitive wavelength to be a long wavelength, the composition according to the invention may contain a sensitizer.

As the sensitizer, it is preferable to sensitize the used polymerization initiator with an electron transfer mechanism or an energy transfer mechanism. Preferable examples of the sensitizer include compounds disclosed in paragraph numbers [0085] to [0098] of JP2008-214395A.

In a case where the sensitizer is included in the composition, the content of the sensitizer is preferably 0.1 to 30 mass %, more preferably 1 to 20 mass %, and even more preferably 2 to 15 mass % with respect to a total solid content of the composition, in view of sensitivity and preservation stability.

((H) Polymerization Inhibitor)

In the manufacturing or the preservation of the composition, the composition according to the invention preferably contains a small amount of a polymerization inhibitor in order to prevent unnecessary thermal polymerization of the polymerizable compound.

As the polymerization inhibitor, a well-known thermal polymerization inhibitor can be used, and specific examples thereof include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and N-nitrosophenylhydroxyamine cerous salt.

The content of the polymerization inhibitor is preferably about 0.01 mass % to about 5 mass % with respect to a total solid content of the composition.

If necessary, in order to prevent polymerization inhibition due to oxygen, a higher fatty acid derivative may be unevenly distributed on a surface of a coated film in the process of dry after coating by adding a higher fatty acid derivative such as behenic acid or behenic acid amide. The addition amount of the higher fatty acid derivative is preferably about 0.5 mass % to about 10 mass % with respect to the entire composition.

((I) Adhesion Improver)

The composition according to the invention may contain an adhesion improver in order to improve adhesiveness with a hard surface with a support or the like. Examples of the adhesion improver include a silane coupling agent and a titanium coupling agent.

As a silane-based coupling agent, γ-methacryloxypropyltrimethoxysilane, γ-methacryloxypropyltriethoxysilane, γ-acryloxypropyltrimethoxysilane, γ-acryloxypropyltriethoxysilane, γ-mercaptopropyltrimethoxysilane, γ-aminopropyltriethoxysilane, and phenyltrimethoxysilane are preferable, and γ-methacryloxypropyltrimethoxysilane is more preferable.

In a case where the adhesion improver is included in the composition, the content of the adhesion improver is preferably 0.5 to 30 mass % and more preferably 0.7 to 20 mass % with respect to a total solid content in the composition.

((J) Surfactant)

In view of more improving coating properties, various surfactants may be added to the composition according to the invention. As the surfactant, various surfactants such as a fluorine-based surfactant, a nonionic surfactant, a cationic surfactant, an anionic surfactant, a silicone-based surfactant can be used.

Particularly, if the composition according to the invention contains a fluorine-based surfactant, liquid characteristics (particularly, fluidity) when the composition is prepared as a coating liquid are further improved. Therefore, evenness of a coating thickness or liquid saving properties can be more improved. That is, in a case where a film is formed by using a coating liquid to which a composition containing a fluorine-based surfactant is applied, wettability to a coated surface is improved and coating properties to a coated surface is improved by decreasing a surface tension between a coated surface and a coating liquid. Therefore, the surfactant is effective, since a film in a homogeneous thickness with small thickness unevenness is more suitably formed even in a case where a thin film in several μm is formed with a small amount of a liquid amount.

The fluorine content in the fluorine-based surfactant is suitably 3 to 40 mass %, more preferably 5 to 30 mass %, and particularly preferably 7 to 25 mass %. A fluorine-based surfactant having a fluorine content in this range is effective in view of evenness of a thickness of a coated film and liquid saving properties and solubility in the composition is also satisfactory.

Examples of the fluorine-based surfactant include MEGAFACE F171, MEGAFACE F172, MEGAFACE F173, MEGAFACE F176, MEGAFACE F177, MEGAFACE F141, MEGAFACE F142, MEGAFACE F143, MEGAFACE F144, MEGAFACE R30, MEGAFACE F437, MEGAFACE F475, MEGAFACE F479, MEGAFACE F482, MEGAFACE F554, MEGAFACE F780, MEGAFACE F781, and MEGAFACE F781F (hereinafter, manufactured by DIC Corporation), FLUORAD FC430, FLUORAD FC431, and FLUORAD FC171 (hereinafter, manufactured by Sumitomo 3M Limited.), SURFLON S-382, SURFLON SC-101, SURFLON SC-103, SURFLON SC-104, SURFLON SC-105, SURFLON SC1068, SURFLON SC-381, SURFLON SC-383, SURFLON S393, and SURFLON KH-40 (hereinafter, manufactured by Asahi Glass Co., Ltd.).

Specific examples of the nonionic surfactant include glycerol, trimethylolpropane, trimethylolethane, ethoxylate and propoxylate thereof (for example, glycerol propoxylate and glycerine ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, and sorbitan fatty acid ester (PLURONIC L10, L31, L61, L62, 10R5, 17R2, and 25R2 and TETRONIC 304, 701, 704, 901, 904, and 150R1 manufactured by BASF SE and SOLSPERSE 20000 (manufactured by Lubrizol Japan Limited)).

Specific examples of the cationic surfactant include a phthalocyanine derivative (Product name: EFKA-745, manufactured by Morishita & Co., Ltd.), organosiloxane polymer KP341 (manufactured by Shin-Etsu Chemical Co., Ltd.), a (meth)acrylic acid-based (co)polymer POLYFLOW No. 75, No. 90, and No. 95 (manufactured by Kyoeisha Chemical Co., Ltd.), and W001 (manufactured by Yusho Co., Ltd.).

Specific examples of the anionic surfactant include W004, W005, and W017 (manufactured by Yusho Co., Ltd.).

Examples of the silicone-based surfactant include "TORAY SILICONE DC3PA", "TORAY SILICONE SH7PA", "TORAY SILICONE DC11PA", "TORAY SILICONE SH21PA", "TORAY SILICONE SH28PA", "TORAY SILICONE SH29PA", "TORAY SILICONE SH30PA", and "TORAY SILICONE SH8400" manufactured by Dow Corning Corporation, "TSF-4440", "TSF-4300", "TSF-4445", "TSF-4460", and "TSF-4452" manufactured by Momentive Performance Materials Inc., "KP341", "KF6001", and "KF6002" manufactured by Shin-Etsu Chemical Co., Ltd., and "BYK307", "BYK323", and "BYK330" manufactured by BYK Japan KK.

The surfactant may be used singly or two or more types thereof may be used in combination. In a case where the surfactant is included in the composition, the content of the surfactant is preferably 0.001 to 2.0 mass % and more preferably 0.005 to 1.0 mass % with respect to a total mass of the composition.

The preparation form of the composition according to the invention is not particularly limited, and the components can be prepared, for example, by performing a dispersion treatment using a stirrer, a homogenizer, a high-pressure emulsification device, a wet pulverizer, or a wet disperser. However, the method thereof is not limited thereto. The dispersion treatment may be performanced by two or more times of a dispersion treatment (multistage dispersion).

<Light Screening Film>

The light screening film according to the invention is formed by using a composition described below. That is, the light screening composition is used for forming a light screening film.

The film thickness of the light screening film is not particularly limited. However, since reflection characteristics of the light screening film are more excellent, the film thickness after dry is preferably 0.2 to 50 µm, more preferably 0.5 to 30 µm, and even more preferably 0.7 to 20 µm.

In a case where the light screening film has a pattern shape, the size thereof (a length of one side) is preferably 0.001 to 5 mm, more preferably 0.05 to 4 mm, and even more preferably 0.1 to 3.5 mm since the effect of the invention can be obtained more effectively.

The optical density of the light screening film in a wavelength of 550 nm is not particularly limited, but in view of the effect of the invention, the optical density is preferably 2 or greater and more preferably 3 or greater. The upper limit is not particularly limited, but is 5 or less in many cases.

As the measuring method of the optical density, a light screening film having a thickness of 2.0 µm is prepared, and optical density is measured by a spectroscopic photometer (U4100, manufactured by Hitachi High-Technologies Corporation). When the optical density is 4 or greater, a light screening film having a thin thickness is prepared, the optical density is measured, and the obtained optical density can be converted by a thickness of 2.0 µm.

<Method of Manufacturing Light Screening Film>

Subsequently, a method of manufacturing a light screening film according to the invention is described.

The method for manufacturing the light screening film according to the invention is not particularly limited, and it is preferable to have a step of coating a predetermined support with the composition, performing a hardening treatment, and forming a light screening film.

The method for coating a composition is not particularly limited, but various coating methods such as a rotation coating method, a spray coating method, slit coating, an inkjet method, rotation coating, casting coating, roll coating, and a screen printing method can be applied. Since productivity is excellent, a spin coating method (spin coating) is preferable.

A method of a hardening treatment is not particularly, and a photoirradiation treatment or a heating treatment is generally performed.

Examples of one suitable aspect of a method for manufacturing a light screening film include a step of forming a composition layer coated with the composition according to the invention (hereinafter, appropriately and simply referred to as a "step of forming a composition layer"), a step of exposing a composition layer via a mask (hereinafter, appropriately and simply referred to as an "exposure step"), and a step of developing a composition layer after exposure and forming a coloration pattern (hereinafter, appropriately and simply referred to as a "developing step").

Hereinafter, respective steps of the suitable aspect are described.

[Step of Forming Composition Layer]

In the step of forming a composition layer, a polymerizable composition layer is formed by coating a predetermined substrate with the composition according to the invention. Examples of the coating method of the composition according to the invention include methods described above.

The composition with which the substrate is coated is preferably dried under the conditions of 70° C. to 110° C. and for about 2 to 4 minutes so as to form a composition layer.

[Exposure Step]

In the exposure step, the composition layer formed in the step of forming the composition layer is exposed via a mask, and only a photoirradiated coated film portion is hardened. It is preferable that the exposure is performed by irradiation of the radioactive ray. As the radioactive ray that can be used at the time of exposure, particularly, ultraviolet rays such as g rays, h rays, and i rays are preferably used, and a high pressure mercury lamp is more preferable. The irradiation strength is preferably 5 to 1,500 mJ/cm$^2$, more preferably 10 to 1,000 mJ/cm$^2$, and most preferably 10 to 800 mJ/cm$^2$.

[Developing Step]

After the exposure step, an alkali developing treatment (developing step) is performed, a portion that is not irradiated with light in the exposure step is eluted with an alkali aqueous solution. Accordingly, only a photocured portion remains. As the developer, an organic alkali developer is desired. The development temperature is generally 20° C. to 30° C., and the development time is 20 to 90 seconds.

As the alkaline aqueous solution, examples of the inorganic developer include sodium hydroxide, potassium hydroxide, sodium carbonate, sodium hydrogen carbonate, sodium silicate, and sodium metasilicate, examples of the organic alkali developer include an alkaline aqueous solution in which a compound such as an alkaline compound such as ammonia water, ethylamine, diethylamine, dimethylethanolamine, tetramethylammonium hydroxide, tetraethylammonium hydroxide, choline, pyrrole, piperidine, and 1,8-diazabicyclo-[5,4,0]-7-undecene is dissolved such that a concentration becomes 0.001 to 10 mass % and preferably becomes 0.01 to 1 mass %. An appropriate amount of a water-soluble organic solvent or surfactant such as methanol or ethanol is added to an alkaline aqueous solution. In a case where a developer consisting of an alkaline aqueous solution is used, washing (rinse) is generally performed with pure water after development.

The method for manufacturing the light screening film according to the invention may include a hardening step of hardening the formed light screening film by heating and/or exposure after the step of forming a composition layer, an exposure step, and a developing step are performed, if necessary. In a case of hardening by heating, examples thereof include a method of performing a hardening treatment for 1 to 10 minutes at 150° C. to 250° C. on a hot plate.

The light screening film formed by the light screening composition according to the invention can be applied to various aspects.

For example, the light screening film according to the invention can be disposed on an edge part portion of a microlens array. More specifically, as illustrated in FIG. 1, examples thereof include an aspect including a substrate 10, a lens 16 disposed on the substrate 10, a closely attached layer 11 disposed on the substrate and disposed between lenses, and a light screening film 12 disposed on the closely attached layer 11.

Figure 2:
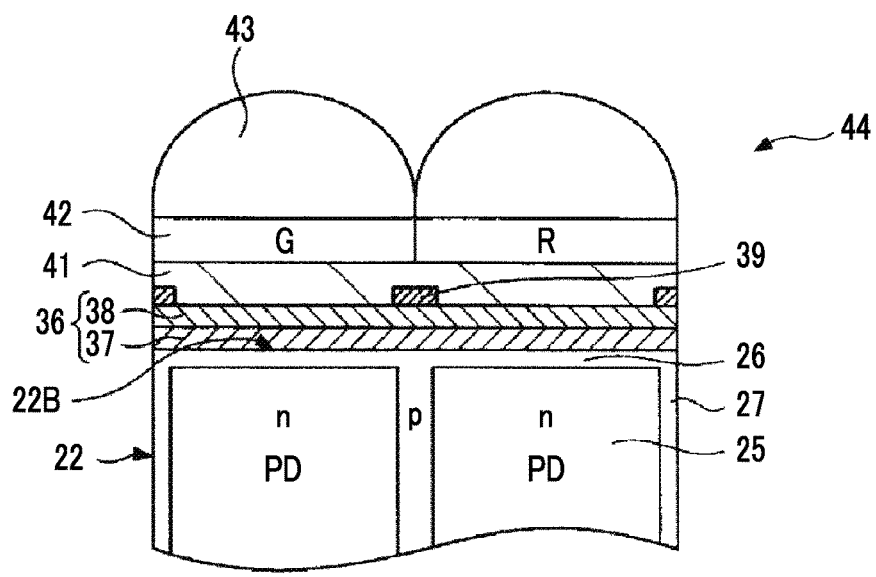
FIG. 2 is a cross-sectional view of a second embodiment to which a light screening film according to the invention is applied.

The light screening film according to the invention can be more suitably used as the light screening film of the solid-state imaging device. A more specific aspect include a solid-state imaging device 44 illustrated in FIG. 2. First, a silicon semiconductor substrate 22 is included in the solid-state imaging device 44. Photodiodes PD corresponding to respective pixels separated by an element separation area 27 according to the p-type semiconductor area are included in the semiconductor substrate 22, and the photodiodes PD are formed to have a p-n junction consisting of an n-type semiconductor area 25 over the entire area of the substrate in the thickness direction and a p-type semiconductor area 26 that faces both of the front and back surfaces of the substrate and that comes into contact with the n-type semiconductor areas 25. An insulation film, which is an antireflection film 36 in this example is formed on a substrate surface 22B that becomes a light receiving surface and a light screening film 39 according to the invention is provided on the antireflection film 36. The antireflection film 36 is formed with plural films having different refractive indexes, and a 2-layered film in which a silicon oxide ($SiO_2$) film 37 and an hafnium oxide ($HfO_2$) film 38 are laminated is provided on the semiconductor substrate 22 in this example. A flattened film 41, an on chip color filter 42 of a bayer array, and an on chip microlens 43 are arranged on the light screening film 39.

Figure 3:
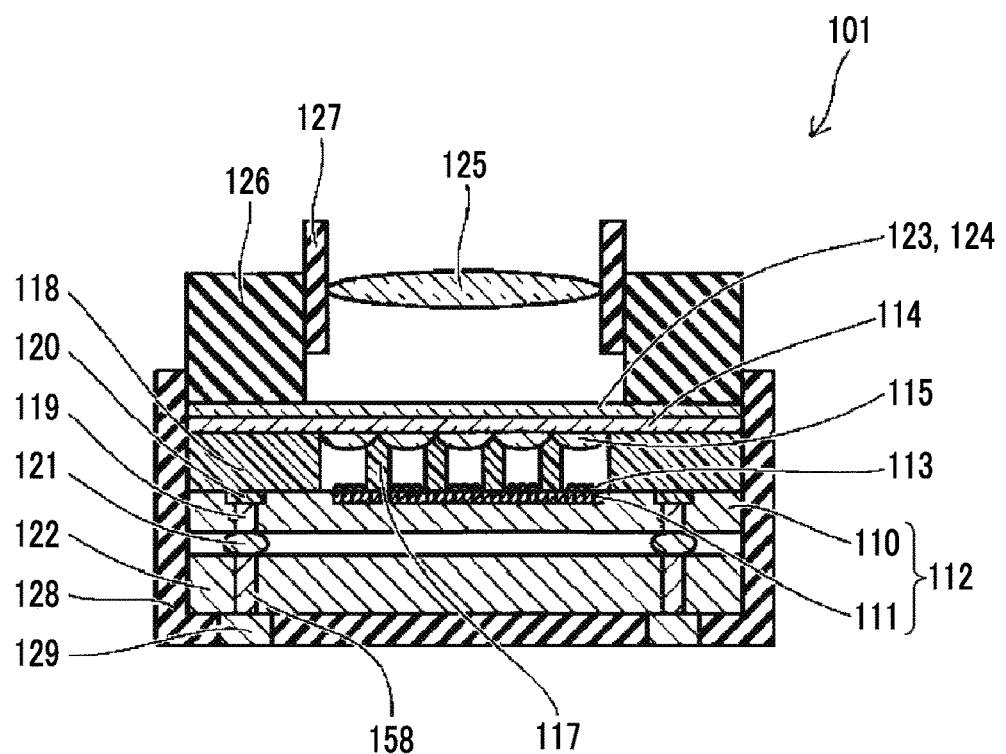
FIG. 3 is a cross-sectional view of a third embodiment to which a light screening film according to the invention is applied.

Examples of the solid-state imaging device to which the light screening film according to the invention is applied include an aspect illustrated in FIG. 3. In a solid-state imaging device 101 illustrated in FIG. 3, a driving and treatment chip 122, a sensor substrate 112, connection posts 117, a microlens array substrate 114, a visible light transmission substrate 123, an optical filter 124, a lens holder 126, a lens barrel 127, an imaging lens 125, and a light shielding cover 128 are provided. The light screening film according to the invention can be applied to the connection posts 117. Plural through electrodes 158 that penetrate the driving and treatment chip 122 are provided in the driving and treatment chip 122. A bump 121 is provided on the through electrodes 158. The sensor substrate 112 is provided on the driving and treatment chip 122 so as to be come into contact with the bump 121. A through electrode 119 is provided on the sensor substrate 112. The lower surface of the through electrode 119 provided on the sensor substrate 112 is provided on the bump 121. Accordingly, the sensor substrate 112 and the driving and treatment chip 122 are connected to each other. The upper surface of the through electrode 119 is connected to an electrode pad 120. The reading out electrode pad 120 is used of pixels 111. The sensor substrate 112 is obtained by forming the plural pixels 111, for example, photodiodes on a semiconductor substrate 110, for example, a silicon substrate. The plural pixels 111 are provided on the upper surface of the sensor substrate 112, in an array shape. Pixel condensation microlenses 113 are provided on the respective pixels 111. One ends of the plural connection posts 117 are joined to the upper surface of the sensor substrate 112. The other ends of the plural connection posts 117 are joined to the microlens array substrate 114. The microlens array substrate 114 is formed by using a transparent substrate, for example, a quartz plate. The plural microlenses 115 are formed on one surface of the microlens array substrate 114. The microlens array substrate 114 is provided such that a surface on which the microlenses 115 are formed in the microlens array substrate 114 face an upper surface of the sensor substrate 112. Edge part portions in which the pixels 111 are not formed in the sensor substrate 112 and edge part portions in which the microlenses 115 are not formed in the microlens array substrate 114 are fixed to each other by spacer resins 118.

Figure 4:
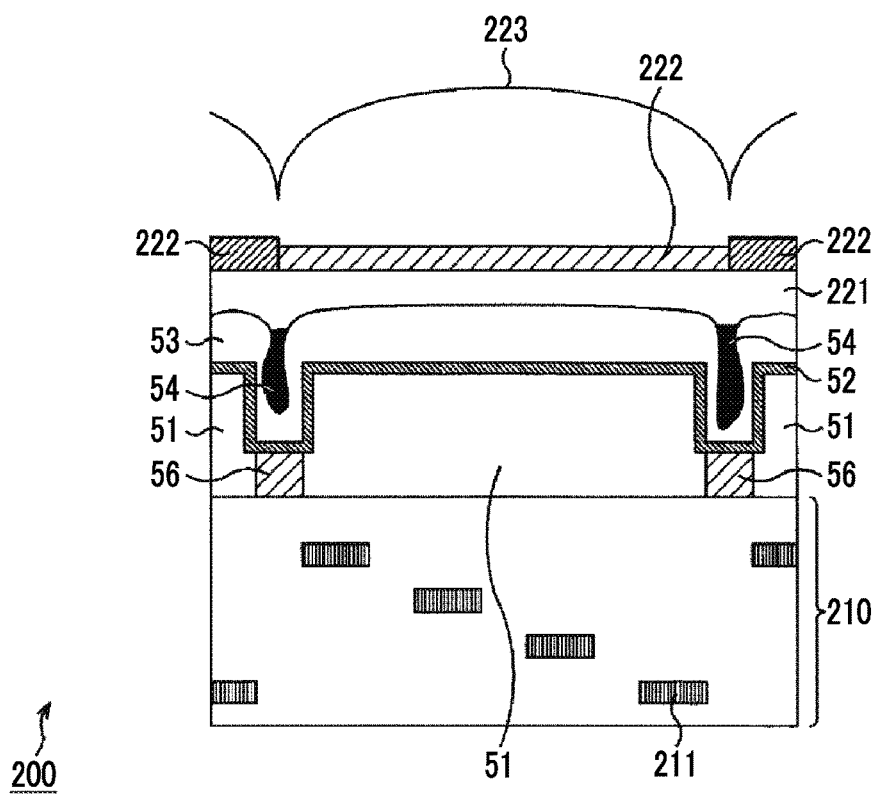
FIG. 4 is a cross-sectional view of a fourth embodiment to which a light screening film according to the invention is applied.

The light screening film according to the invention can be suitably used as the light screening film of a back surface irradiation CMOS sensor light receiving section. More specific aspect include a CMOS sensor light receiving section 200 illustrated in FIG. 4. In FIG. 4, the lower surface in the figure is a front surface side, and an upper side is a back surface side. This upper side (back surface side) is a light receiving surface to which light is incident, and a photodiode 51 performs photoelectric conversion on incidence rays that are incident from this light receiving surface. As illustrated in FIG. 4, a wiring layer 210 on which wiring 211 is formed is formed on the front surface side of the semiconductor substrate on which the photodiode 51, a pixel separation layer 56, an embedded-type light screening film 54, and the like are formed. The light screening film according to the invention is provided on a light screening film 54. A flattened film 221, a color filter 222, and a condensation lens 223 are laminated on the back surface side of the light screening film 54 and an insulation film 53.

In addition to the above, the shielding film of this specification can be used in a light screening film 20 of FIG. 10 in JP2013-68688A. The shielding film of this specification can be used in a light screening layer 311J of FIG. 15 in JP2012-169488A. The shielding film of this specification can be used in a black matrix 6 of FIG. 1 of JP2010-134042A. The shielding film of this specification can be used in a light screening film 41 of FIG. 4 of JP2013-145779A. The shielding film of this specification can be used in a light screening film 59 of FIG. 12 of JP2013-90085A can be used. A shielding film of this specification can be used in a light screening film 16 of FIG. 2 of JP2010-45192A. The shielding film of this specification can be used on the surface on the opposite side of a lens 11 of a print wiring substrate 9 of FIG. 5 of JP2012-23667A. The shielding film of this specification can be used in a light screening film 14 of FIG. 1 of JP2012-204387A. The shielding film of this specification can be used in a light screening film of FIG. 7 of JP2010-283271A. The shielding film of this specification can be used in a light screening member 51 of FIG. 12 of JP2012-18993A. The shielding film of this specification can be used in a concave substrate 3 and a resin 4 of FIG. 1 of JP2010-199410A. The shielding film of this specification can be used on the surface of bonding wire 5 of FIG. 1 of JP2010-283311A. The shielding film of this specification can be used on a light screening and electromagnetic shield 19 of FIG. 1 of JP2010-186947A. The shielding film of this specification can be used on an insulating light screening film 16 of FIG. 2 of JP2011-198846A.

EXAMPLES

Hereinafter, the invention is described in detail with reference to examples, but the invention is not limited to the examples without departing from the gist of the invention.

Unless described otherwise, a "part" is based on mass.

(Preparation of Resist Liquid for Flattened Film) Components of the composition below are mixed and stirred with a stirrer, so as to prepare a resist liquid for a flattened film.

<Composition of Resist Liquid for Flattened Film>

| | |
|---|---|
| Benzyl methacrylate/methacrylic acid copolymer (=70/30 [molar ratio], weight-average molecular weight: 30,000, manufactured by Fujikurakasei Co., Ltd., Product name: ACRYBASE FF-187) | 16.4 parts |
| Dipentaerythritol pentaacrylate (manufactured by Nippon Kayaku Co., Ltd., Product name: KAYARAD DPHA) | 6.5 parts |
| Propylene glycol monomethylethyl acetate (manufactured by DAICEL Corporation, Product name: MMPGAC) | 13.8 parts |
| Ethyl 3-ethoxypropionate (manufactured by Nagase & Co., Ltd., Product name: ETHYL 3-ETHOXYPROPIONATE) | 12.3 parts |
| Initiator Irgacure OXE02 | 0.3 parts |

(Forming of Flattened Film)

A 6-inch silicon wafer was prepared, this wafer was coated with the resist liquid for a flattened film obtained above by spin coating in an homogeneous manner, a coated film was formed, and the formed coated film was subjected to a heating treatment for 120 seconds on a hot plate at a surface temperature of 120° C. Here, the spin coating was performed by adjusting a coating rotation speed such that a film thickness of a coated film after heating treatment was about 2 μm. Subsequently, the coated film after the heating treatment was subjected to the heating treatment for one hour in an oven at 220° C., and a coated film was hardened to obtain a flattened film.

In the manner described above, a wafer with a flattened film in which a flattened film was formed on a 6-inch silicon wafer was obtained.

Example 1

Manufacturing of Light Screening Film (Light Screening Color Filter)

(1) Preparation of Light Screening Composition (Black Photosensitive Resin Composition)

Components of the composition below were mixed, so as to prepare a light screening composition.

<Composition>

| | |
|---|---|
| Pigment dispersion liquid A (K-042884-2, manufactured by Toyo Ink Co., Ltd.) [containing 19.3 mass % of a black pigment (carbon black), 8.5 mass % of dispersing agent A (ACRYBASE FFS-6824, manufactured by Fujikurakasei Co., Ltd.), 16.2 mass % of cyclohexanone, 38.4 mass % of propylene glycol monomethyl ether acetate, and 17.6 mass % of ethyl-3-ethoxypropionate] | 45 parts |
| Resin A [Resin A: CYCLOMER P (ACA) 230AA, manufactured by DAICEL-Allnex Ltd.] | 5 parts |
| Polymerizable monomer (dipentaerythritol pentaacrylate, manufactured by Nippon Kayaku Co., Ltd., Product name: KAYARAD DPHA) | 7 parts |
| Polymerizable monomer (KAYARAD RP-1040, manufactured by Nippon Kayaku Co., Ltd.) | 7 parts |
| Photopolymerization initiator A (Oxime-based compound I, manufactured by BASF SE, Product name: IRGACURE OXE02) | 2.5 parts |
| Solvent (propylene glycol monomethyl ether acetate, manufactured by DAICEL Corporation, Product name: MMPGAC) | 20 parts |
| Solvent (ethyl-3-ethoxypropionate, manufactured by DAICEL Corporation, Product name: MMPGAC) | 15 parts |
| Surfactant (MEGAFACE F-144, manufactured by DIC Corporation; fluorine-based surfactant) | 0.04 parts |
| Polymerization inhibitor (p-methoxyphenol, manufactured by Kanto Chemical Co., Inc., Product name: p-methoxyphenol) | 0.003 parts |

(2) Manufacturing of Light Screening Film (Black Film)

After the flattened film of the silicon wafer was coated with the obtained light screening composition by spin coating, the heating treatment was performed with a hot plate at the temperature of the coated film surface of 90° C. for 120 seconds, a light screening film in a dry film thickness of 2 μm was formed.

(3) Forming of Black Pattern Subsequently, the light screening film after drying was exposed in an exposure amount of 1,000 mJ/m$^2$ by an i ray stepper (FPA-3000i5+ manufactured by Canon Inc.) via a mask pattern in which square pixel patterns having sides of 5.0 μm are arranged in an area of 4 mm×3 mm on the substrate in a matrix shape. After the pattern exposure, a light screening film was subjected to puddle development at 23° C. for 60 seconds by using a 60% aqueous solution [aqueous solution (pH=10) including 0.3% of tetramethylammonium hydroxide by mass fraction and nonionic surfactant] of an organic alkaline developer CD-2000 (manufactured by Fujifilm Electronic Materials).

Thereafter, rinse was performed with pure water by spin shower for 20 seconds. Thereafter, after washing was performed with pure water, water drops were removed by a spin treatment at 2,500 rpm for 30 seconds, the silicon wafer was naturally dried, and post baking was performed with a hot plate at 220° C. for 300 seconds.

As described above, a light screening film pattern (black pattern) was formed on the silicon wafer.

<Evaluation>

The light screening composition and the light screening film pattern obtained above were evaluated as below. Results of the evaluation and measurement are provided in Table 1 as below.

(Optical Density)

Optical density of the light screening film formed on the flattened film of the silicon wafer before the exposure and the developing treatment at a wavelength of 550 nm was measured by a spectroscopic photometer (U4100, Hitachi High-Technologies Corporation) so as to obtain optical density (OD550) at a thickness of 2.0 μm.

(Adhesiveness)

Among the pixel patterns formed in a matrix shape, whether pattern defects are generated due to peeling from the silicon wafer was observed with a measuring SEM (S-7800H, manufactured by Hitachi Ltd.) and was evaluated according to the evaluation standard.

<Evaluation Standard>

A: Pattern deficiency was not observed at all.

B: Pattern deficiency was seldom observed, but partial deficiency was observed.

C: Great pattern deficiency was remarkably observed.

(Development Residue)

Among the surface for forming the pattern of the silicon wafer after developing treatment, whether a residue in an area (unirradiated area) that is not irradiated with light exists was observed with a measuring SEM (S-7800H, manufactured by Hitachi Ltd.) and evaluated in the evaluation standard below.

<Evaluation Standard>

A: A residue was not observed in an unirradiated area at all.

B: Slight residues were observed in an unirradiated area, but the residues were not a problem, practically.

C: The residues were remarkably observed in the unirradiated area.

(Adhesiveness after the Lapse of Time and Development Residue after the Lapse of Time)

After the light screening composition was preserved at 23° C. for two months, evaluation was performed in (adhesiveness) and (development residue) in the same manner. The light screening composition was evaluated in the adhesiveness after the lapse of time and the development residue after the lapse of time.

Examples 2 to 4, and Comparative Examples 1 and 2

In Example 1, the light screening composition was prepared and the light screening film pattern was formed in the same manner as Example 1 except for changing the composition of the light screening composition as shown in Table 1, and the same evaluation was performed.

The evaluation results are collectively provided in Table 1 below.

Compounds described in a "dispersing resin" section and a "binder polymer" section of Table 1 are provided below.

Resin B: ACRYCURE RD-F8 (manufactured by Nippon Shokubai Co., Ltd.)

Resin C: ACRYBASE FF-187 (manufactured by Fujikurakasei Co., Ltd.)

Dispersing agent B: Copolymer below (Numerical values in the drawing represent mol % of respective repeating units)

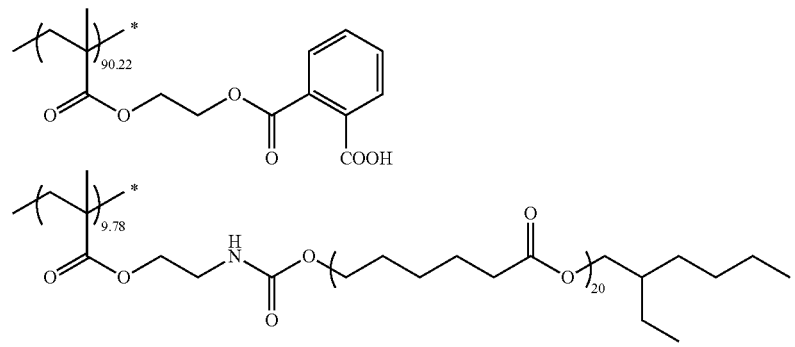

TABLE 1

| | Dispersing resin | | Binder polymer | | | | Light screening film | Evaluation | | | |
| --- | --- | --- | --- | --- | --- | --- | --- | --- | --- | --- | --- |
| | Type | SP value (MPa)$^{1/2}$ | Type | Acid value (mg KOH/g) | Weight-average molecular weight | SP value (MPa)$^{1/2}$ | OD 550 nm | Adhesiveness | Development residue | Adhesiveness after the lapse of time | Development residue after the lapse of time |
| Example 1 | Dispersing agent A | 20 | Resin A | 30 | 14,000 | 25 | 4 | A | A | A | A |
| Example 2 | dispersing agent B | 21 | Resin A | 30 | 14,000 | 25 | 4 | A | B | A | B |
| Example 3 | Dispersing agent A | 20 | Resin B | 31 | 11,000 | 24 | 4 | A | A | A | A |
| Example 4 | dispersing agent B | 21 | Resin B | 31 | 11,000 | 24 | 4 | A | B | A | B |
| Comparative Example 1 | Dispersing agent A | 20 | Resin C | 100 | 30,000 | 21 | 4 | C | A | C | B |
| Comparative Example 2 | dispersing agent B | 21 | Resin C | 100 | 30,000 | 21 | 4 | C | A | C | B |

As shown in Table 1, in a case where the light screening composition according to the invention was used, it was confirmed that a light screening film in which adhesiveness to the substrate and residue removability at die time of developing are excellent was formed. Even if the composition was preserved for a predetermined period of time, a predetermined effect was able to be obtained.

Meanwhile, in Comparative Examples 1 and 2 in which compositions that do not satisfy the requirements of the invention were used, a desired effect was not able to be obtained.

EXPLANATION OF REFERENCES 10 substrate
11 closely attached layer
12 light screening film
16 lens
22 semiconductor substrate
25 n-type semiconductor area
26 p-type semiconductor area
27 element separation area
36 antireflection film
37 silicon oxide film
38 hafnium oxide film
39 light screening film
41 flattened film
42 on chip color filter
43 on chip microlens
44 solid-state imaging device
51 photodiode
53 insulation film
54 light screening film
56 pixel separation layer
101 solid-state imaging device
110 semiconductor substrate
111 pixel
112 sensor substrate
113 pixel condensation microlens
114 microlens array substrate
115 microlens
117 connection post
118 spacer resin
119 through electrode
120 reading out electrode pad
121 bump
122 driving and treatment chip
123 visible light transmission substrate
124 optical filter
125 imaging lens
126 lens holder
127 lens barrel
128 light shielding cover
129 module electrode
158 through electrode
200 CMOS sensor light receiving section
210 wiring layer
211 wiring
221 flattened film
222 color filter
223 condensation lens

What is claimed is:

1. A light screening composition, comprising:
   any one of light screening particles and a light screening dye;
   a dispersing resin;
   a binder polymer having an acid value of 50 mg KOH/g or less and a weight-average molecular weight of 8,000 to 50,000; and
   a polymerizable compound, and
   wherein an acid value of the binder polymer is 20 to 50 mg KOH/g, and an SP value thereof is 15 to 30 $(MPa)^{1/2}$.

2. The light screening composition according to claim 1, wherein an SP value of the dispersing resin is 15 to 30 $(MPa)^{1/2}$.

3. The light screening composition according to claim 2, wherein an absolute value of a difference between an SP value of the dispersing resin and an SP value of the binder polymer is 3 $(MPa)^{1/2}$ or greater, and the difference represents an SP value of the dispersing resin—an SP value of the binder polymer.

4. The light screening composition according to claim 3, wherein any one of the light screening particles and the light screening dye is carbon black.

5. The light screening composition according to claim 2, wherein any one of the light screening particles and the light screening dye is carbon black.

6. The light screening composition according to claim 1, wherein an absolute value of a difference between an SP value of the dispersing resin and an SP value of the binder polymer is 3 $(MPa)^{1/2}$ or greater, and the difference represents an SP value of the dispersing resin—an SP value of the binder polymer.

7. The light screening composition according to claim 6, wherein any one of the light screening particles and the light screening dye is carbon black.

8. The light screening composition according to claim 1, wherein any one of the light screening particles and the light screening dye is carbon black.

9. A light screening composition, comprising:
   any one of light screening particles and a light screening dye;
   a dispersing resin;
   a binder polymer having an acid value of 50 mg KOH/g or less and a weight-average molecular weight of 8,000 to 50,000; and
   a polymerizable compound, and
   wherein an SP value of the dispersing resin is 15 to 30 $(MPa)^{1/2}$.

10. The light screening composition according to claim 9, wherein an absolute value of a difference between an SP value of the dispersing resin and an SP value of the binder polymer is 3 $(MPa)^{1/2}$ or greater, and the difference represents an SP value of the dispersing resin—an SP value of the binder polymer.

11. The light screening composition according to claim 10, wherein any one of the light screening particles and the light screening dye is carbon black.

12. The light screening composition according to claim 9, wherein any one of the light screening particles and the light screening dye is carbon black.

13. A light screening composition, comprising:
   any one of light screening particles and a light screening dye;
   a dispersing resin;
   a binder polymer having an acid value of 50 mg KOH/g or less and a weight-average molecular weight of 8,000 to 50,000; and
   a polymerizable compound, and
   wherein an absolute value of a difference between an SP value of the dispersing resin and an SP value of the binder polymer is 3 $(MPa)^{1/2}$ or greater, and the difference represents an SP value of the dispersing resin—an SP value of the binder polymer.

14. The light screening composition according to claim 13, wherein any one of the light screening particles and the light screening dye is carbon black.

* * * * *